(12) United States Patent
Hashimoto

(10) Patent No.: US 11,017,837 B2
(45) Date of Patent: May 25, 2021

(54) MEMORY SYSTEM

(71) Applicant: KIOXIA CORPORATION, Tokyo (JP)

(72) Inventor: Toshifumi Hashimoto, Fujisawa Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/812,944

(22) Filed: Mar. 9, 2020

(65) Prior Publication Data

US 2021/0065771 A1 Mar. 4, 2021

(30) Foreign Application Priority Data

Sep. 4, 2019 (JP) .............................. JP2019-161211

(51) Int. Cl.
*G11C 16/26* (2006.01)
*G11C 11/4074* (2006.01)
*G11C 11/4076* (2006.01)
*G11C 16/34* (2006.01)
*G11C 11/409* (2006.01)
*G11C 11/408* (2006.01)

(52) U.S. Cl.
CPC ........ *G11C 11/4074* (2013.01); *G11C 11/409* (2013.01); *G11C 11/4076* (2013.01); *G11C 11/4085* (2013.01); *G11C 16/26* (2013.01); *G11C 16/34* (2013.01)

(58) Field of Classification Search
CPC ...................................................... G11C 16/26
USPC ................................................... 365/189.15
See application file for complete search history.

(56) References Cited

U.S. PATENT DOCUMENTS

| 7,913,032 | B1* | 3/2011 | Cornwell ............ G06F 12/0246 |
| | | | 711/103 |
| 8,929,140 | B2 | 1/2015 | Nagashima |
| 9,449,695 | B2 | 9/2016 | Kim et al. |
| 10,255,979 | B1* | 4/2019 | Shimura ............ G11C 16/3459 |
| 2009/0267128 | A1 | 10/2009 | Maejima |
| 2009/0268522 | A1 | 10/2009 | Maejima |
| 2010/0207195 | A1 | 8/2010 | Fukuzumi et al. |
| 2010/0214838 | A1 | 8/2010 | Hishida et al. |
| 2011/0284946 | A1 | 11/2011 | Kiyotoshi |

(Continued)

FOREIGN PATENT DOCUMENTS

JP 5349256 B2 11/2009
JP 2019057342 A 4/2019

(Continued)

*Primary Examiner* — Min Huang
(74) *Attorney, Agent, or Firm* — Holtz, Holtz & Volek PC

(57) ABSTRACT

According to one embodiment, a memory system includes: a semiconductor memory including a memory cell array, the memory cell array including a memory cell, and a controller configured to issue a first read command sequence after a lapse of a first time period from access to the semiconductor memory, and issue a second read command sequence after a lapse of a second time period from access to the semiconductor memory. When the controller issues the first read command sequence, the semiconductor memory applies a first voltage and a second voltage to the memory cell. When the controller issues the second read command sequence, the semiconductor memory applies a third voltage and a fourth voltage to the memory cell.

28 Claims, 20 Drawing Sheets

(56) References Cited

U.S. PATENT DOCUMENTS

| | | | |
|---|---|---|---|
| 2012/0069663 A1 | 3/2012 | Itagaki et al. | |
| 2012/0307557 A1 | 12/2012 | Itagaki | |
| 2017/0322842 A1 | 11/2017 | Iwaki et al. | |
| 2018/0174652 A1* | 6/2018 | Terada | G11C 13/0023 |
| 2018/0277204 A1* | 9/2018 | Takada | G11C 13/0033 |
| 2019/0088333 A1 | 3/2019 | Shirakawa et al. | |
| 2019/0198126 A1* | 6/2019 | Tsubouchi | G11C 11/5671 |

FOREIGN PATENT DOCUMENTS

| | | |
|---|---|---|
| JP | 2019057346 A | 4/2019 |
| JP | 2019117679 A | 7/2019 |
| WO | 2016088448 A1 | 6/2016 |

\* cited by examiner

| BLK address | Latest access time |
|---|---|
| BA0 | TIME_0 |
| BA1 | TIME_1 |
| BA2 | – |
| BA3 | TIME_3 |

FIG. 5

| Elapsed time period $\Delta t$ | Additional command |
|---|---|
| $\Delta t < \Delta t1$ | CMD_T |
| $\Delta t1 \leq \Delta t \leq \Delta t2$ | None |
| $\Delta t > \Delta t2$ | CMD_T |

FIG. 6

| Read operation | AR | BR | CR | DR | ER | FR | GR |
|---|---|---|---|---|---|---|---|
| Shift amount $\Delta V$ | $\Delta VA$ | $\Delta VB$ | $\Delta VC$ | $\Delta VD$ | $\Delta VE$ | $\Delta VF$ | $\Delta VG$ |

F I G. 9

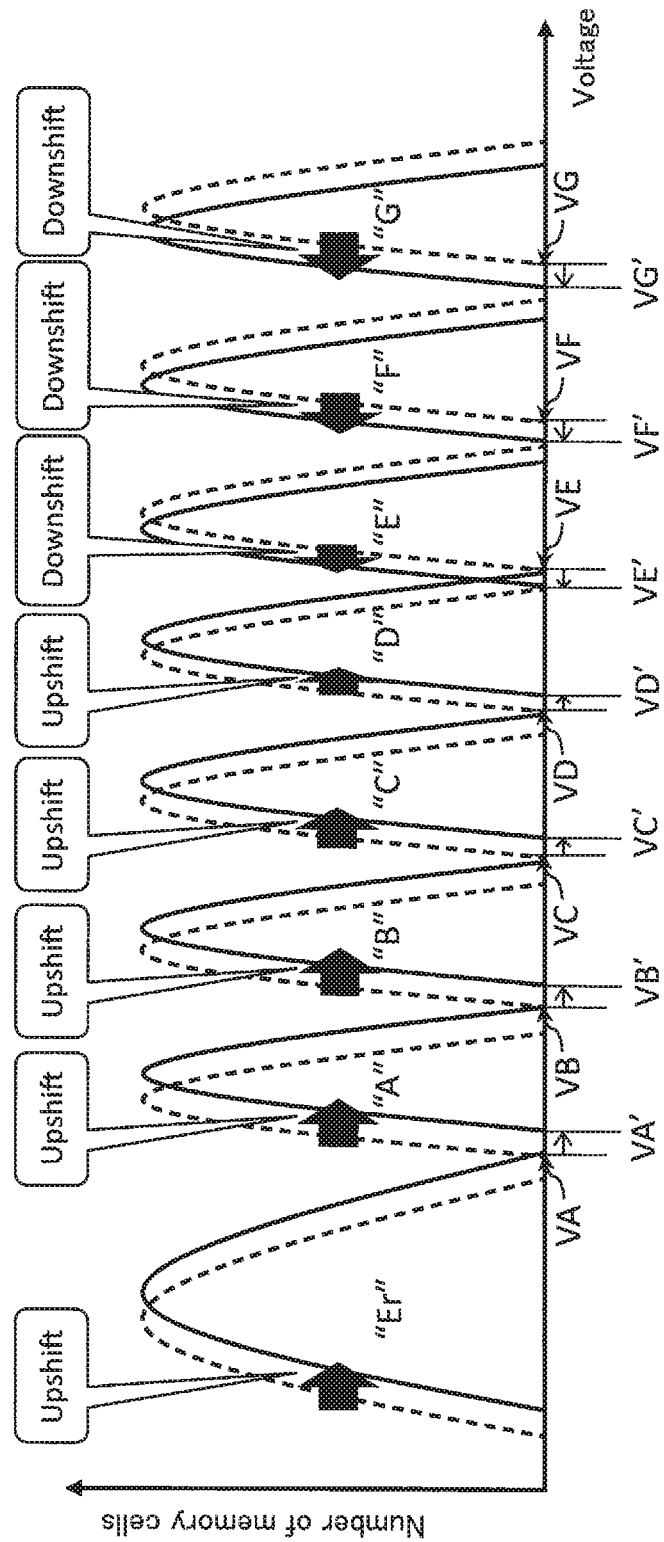
F I G. 10A

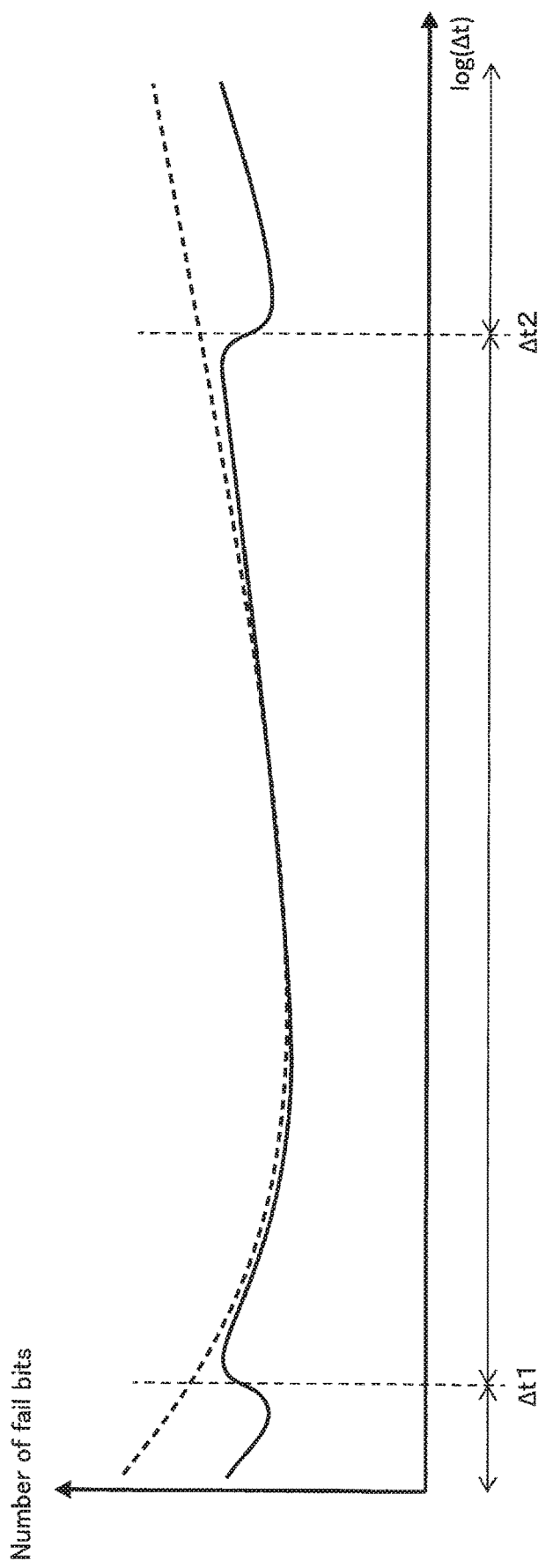

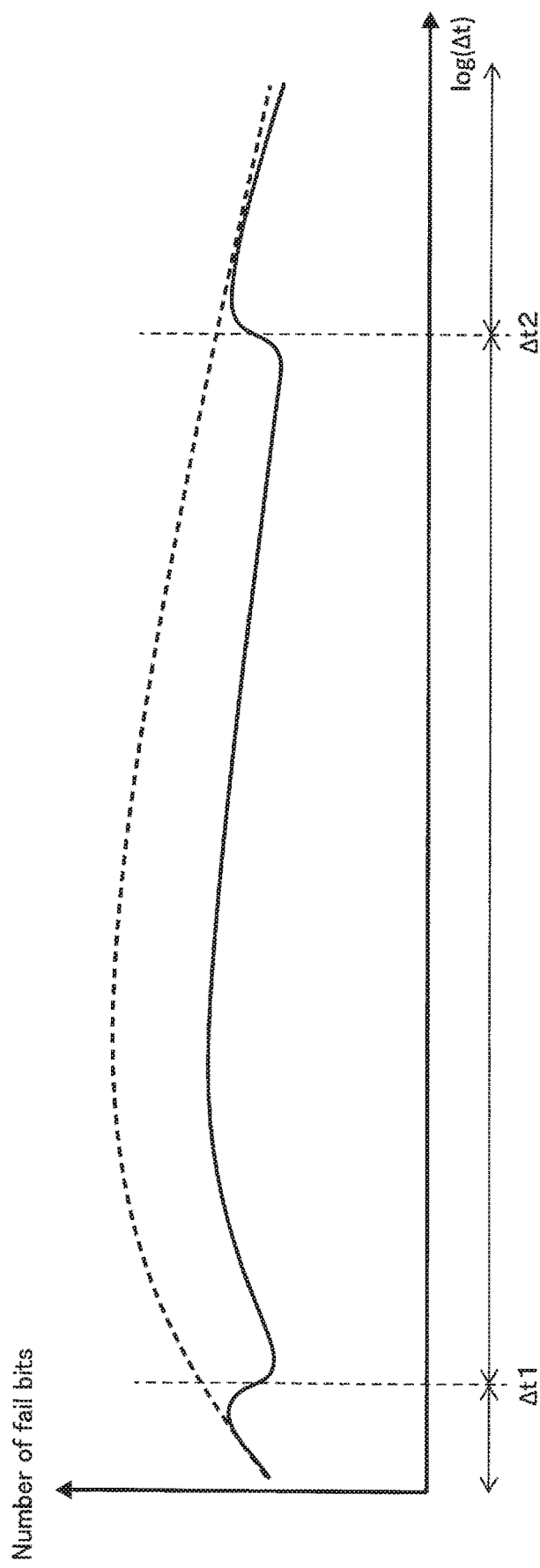
F I G. 12

| Elapsed time period $\Delta t$ | Additional command | Shift amount $\Delta V$ | | | | | | | |
|---|---|---|---|---|---|---|---|---|---|
| | | VA | VB | VC | VD | VE | VF | VG |
| $\Delta t < \Delta t1$ | CMD_T +DATA_T | $\Delta$VA | $\Delta$VB | $\Delta$VC | $\Delta$VD | $\Delta$VE | $\Delta$VF | $\Delta$VG |
| $\Delta t1 \leq \Delta t \leq \Delta t2$ | None | 0 | 0 | 0 | 0 | 0 | 0 | 0 |
| $\Delta t > \Delta t2$ | CMD_T +DATA_T | $\Delta$VA | $\Delta$VB | $\Delta$VC | $\Delta$VD | $\Delta$VE | $\Delta$VF | $\Delta$VG |

F I G. 13

| Elapsed time period $\Delta t$ | Additional command | Shift amount $\Delta V$ | | | | | | |
|---|---|---|---|---|---|---|---|---|
| | | VA | VB | VC | VD | VE | VF | VG |
| $\Delta t < \Delta t1'$ | CMD_T +DATA_T1 | $\Delta VA1'$ | $\Delta VB1'$ | $\Delta VC1'$ | $\Delta VD1'$ | $\Delta VE1'$ | $\Delta VF1'$ | $\Delta VG1'$ |
| $\Delta t1' \leq \Delta t < \Delta t2'$ | CMD_T +DATA_T2 | $\Delta VA2'$ | $\Delta VB2'$ | $\Delta VC2'$ | $\Delta VD2'$ | $\Delta VE2'$ | $\Delta VF2'$ | $\Delta VG2'$ |
| $\Delta t2' \leq \Delta t \leq \Delta t3'$ | None | 0 | 0 | 0 | 0 | 0 | 0 | 0 |
| $\Delta t3' < \Delta t \leq \Delta t4'$ | CMD_T +DATA_T3 | $\Delta VA3'$ | $\Delta VB3'$ | $\Delta VC3'$ | $\Delta VD3'$ | $\Delta VE3'$ | $\Delta VF3'$ | $\Delta VG3'$ |
| $\Delta t > \Delta t4'$ | CMD_T +DATA_T4 | $\Delta VA4'$ | $\Delta VB4'$ | $\Delta VC4'$ | $\Delta VD4'$ | $\Delta VE4'$ | $\Delta VF4'$ | $\Delta VG4'$ |

F I G. 14A

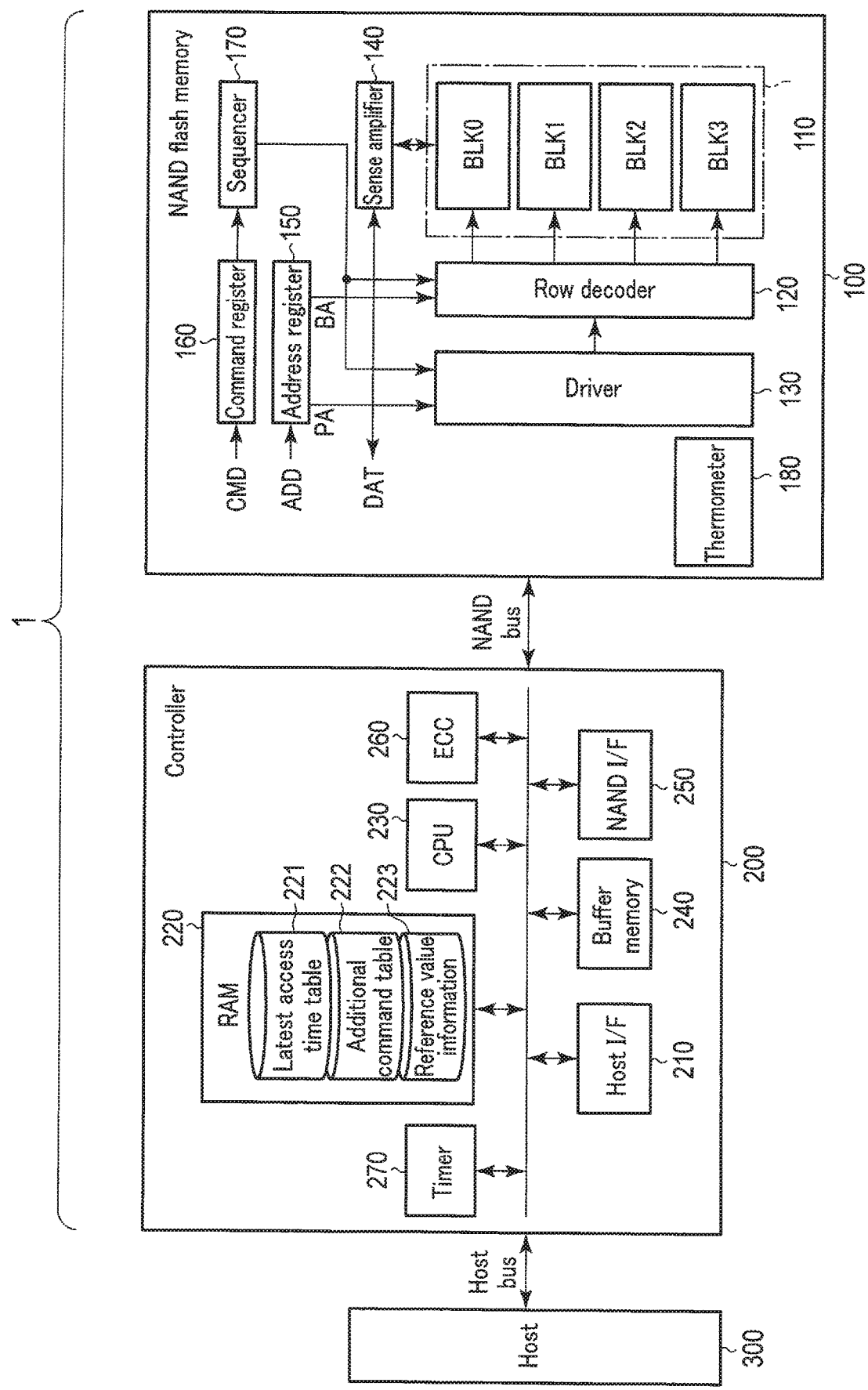
F I G. 15

| Temperature T | Reference value | |
|---|---|---|
| | $\Delta t1$ | $\Delta t2$ |
| $T1 < T$ | $\Delta t1a$ | $\Delta t2a$ |
| $T1 \leq T \leq T2$ | $\Delta t1b$ | $\Delta t2b$ |
| $T > T2$ | $\Delta t1c$ | $\Delta t2c$ |

F I G. 16

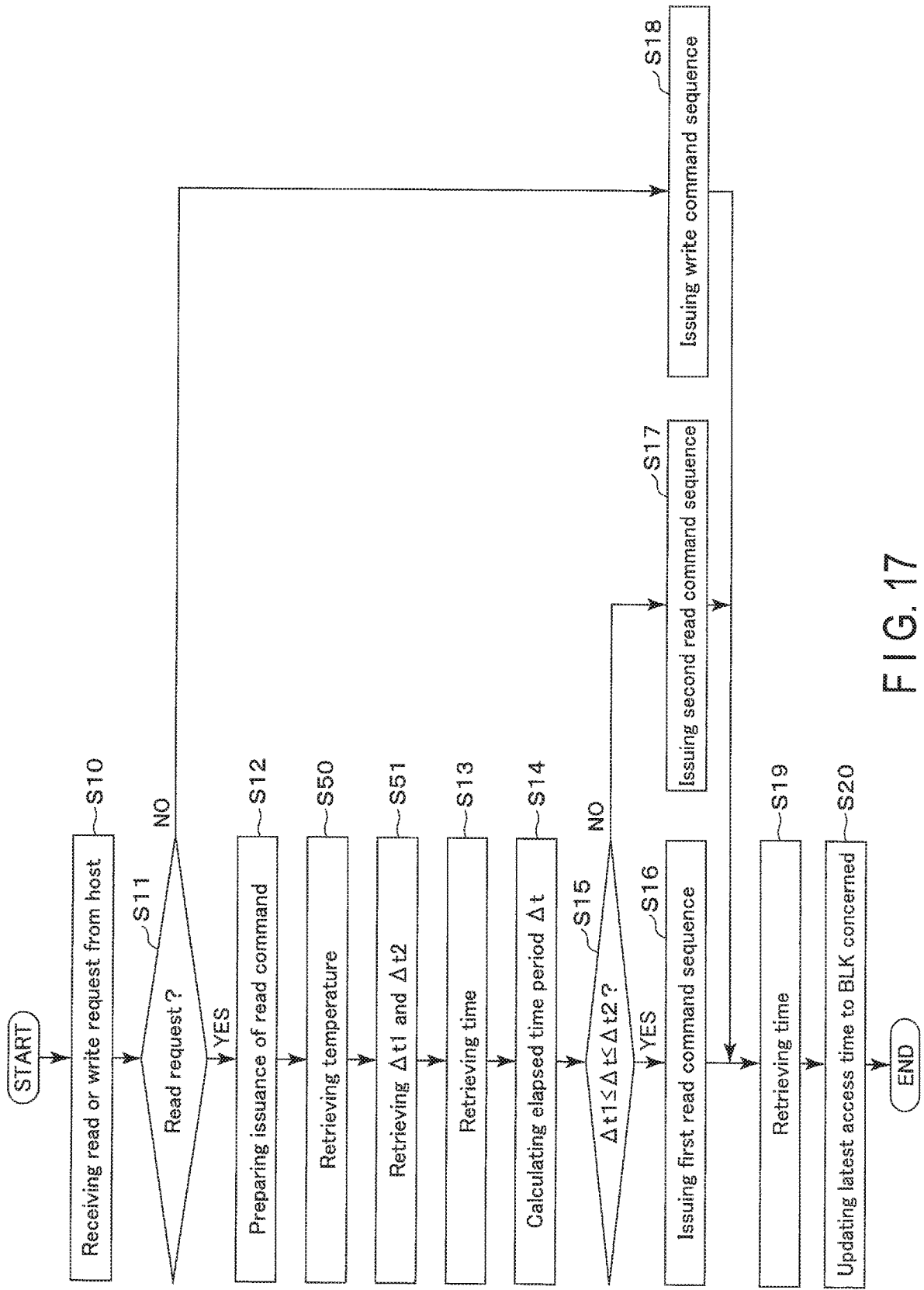
F I G. 17

MEMORY SYSTEM

CROSS-REFERENCE TO RELATED APPLICATIONS

This application is based upon and claims the benefit of priority from Japanese Patent Application No. 2019-161211, filed Sep. 4, 2019, the entire contents of which are incorporated herein by reference.

FIELD

Embodiments described herein relate generally to a memory system.

BACKGROUND

Semiconductor memories having memory cells three-dimensionally arranged have been known.

BRIEF DESCRIPTION OF THE DRAWINGS

FIG. 5 is a conceptual diagram of a latest access time table according to the first embodiment.
FIG. 6 is a conceptual diagram of an additional command table according to the first embodiment.
FIG. 9 is a conceptual diagram of a table showing a relation between each read operation and each shift amount according to the first embodiment.
FIG. 10A is a graph showing each shift in each threshold distribution of each memory cell.
FIG. 10B is a view showing a relation between an elapsed time period since the latest access and the number of fail bits according to the first embodiment.
FIG. 12 is a view showing a relation between an elapsed time period since the latest access and the number of fail bits according to the second embodiment.
FIG. 13 is a conceptual diagram of an additional command table according to the third embodiment.
FIG. 14A is a conceptual diagram of an additional command table according to the sixth embodiment.
FIG. 15 is a block diagram of a memory system according to the seventh embodiment.
FIG. 16 is a conceptual diagram of reference value information according to the seventh embodiment.
FIG. 17 is a flowchart of read and write operations according to the seventh embodiment.

DETAILED DESCRIPTION

In general, according to one embodiment, a memory system includes: a semiconductor memory including a memory cell array, the memory cell array including a memory cell configured to hold data, and a controller configured to issue a first read command sequence for reading the data from the memory cell after a lapse of a first time period from access to the semiconductor memory, and issue a second read command sequence after a lapse of a second time period from access to the semiconductor memory, the second time period being different from the first time period. The memory cell is configured to hold the data of 2 bits or more. When the controller issues the first read command sequence, the semiconductor memory applies a first voltage and a second voltage different from the first voltage to the memory cell. When the controller issues the second read command sequence, the semiconductor memory applies a third voltage different from the second voltage, and a fourth voltage different from the first voltage and the third voltage to the memory cell. The third voltage is more than the first voltage, and the fourth voltage is less than the second voltage. The first read command sequence and the second read command sequence read the same bits from the data of 2 bits or more held by the memory cell.

Hereinafter, embodiments will be described with reference to the drawings. In the following description, structural elements having similar functions and configurations will be denoted by the same reference symbols.

1. First Embodiment

A memory system according to the first embodiment will be described. The following description will be provided while taking a memory system including a NAND flash memory as an example of a semiconductor memory device.

1.1 Configuration

1.1.1 Overall Configuration of Memory System

First, a broad configuration of a memory system according to the present embodiment will be described with reference to FIG. 1.

Figure 1:
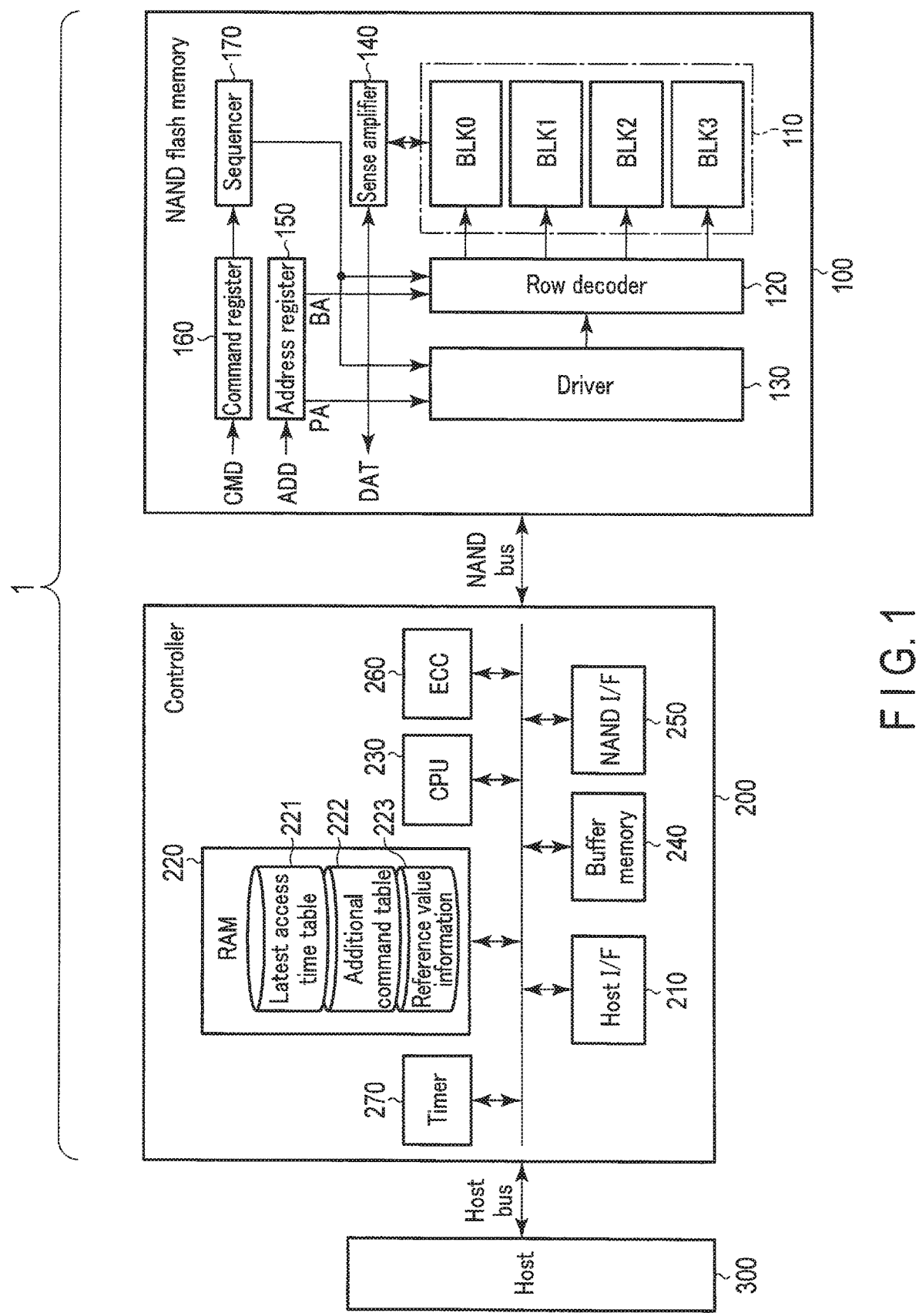
FIG. 1 is a block diagram of a memory system according to the first embodiment.

As shown in FIG. 1, a memory system 1 includes a NAND flash memory 100 and a controller 200. The NAND flash memory 100 and the controller 200 may form one semiconductor device in combination, for example. The semiconductor device is, for example, a memory card such as an SD™ card, a solid state drive (SSD), etc. The controller 200 may be, for example, a system on chip (SoC), etc.

The NAND flash memory 100 includes a plurality of memory cells to store data in a non-volatile manner. The controller 200 is coupled to the NAND flash memory 100 by a NAND bus and is coupled to a host device 300 by a host bus. The controller 200 controls the NAND flash memory 100, and accesses the NAND flash memory 100 in response to a request received from the host device 300. The host device 300 is, for example, a digital camera, a personal computer, etc. The host bus is, for example, an SD™ interface-compatible bus. The NAND bus performs signal transmission/reception in compliance with a NAND interface.

1.1.2 Configuration of Controller 200

Details of the configuration of the controller 200 will be described with continued reference to FIG. 1. As shown in FIG. 1, the controller 200 includes a host interface circuit 210, a built-in memory (RAM) 220, a processor (CPU) 230, a buffer memory 240, a NAND interface circuit 250, an error checking and correcting (ECC) circuit 260, and a timer 270.

The host interface circuit 210 is coupled to the host device 300 via the host bus to transfer requests and data received from the host device 300 respectively to the processor 230 and the buffer memory 240. The host interface circuit 210 also transfers data in the buffer memory 240 to the host device 300 in response to an instruction from the processor 230.

The processor 230 controls the operations of the entire controller 200. For example, in response to receipt of a read request from the host device 300, the processor 230 orders the NAND interface circuit 250 to issue a read command. A similar process is performed for writing and erasing. The processor 230 also executes various types of processing, such as wear leveling, for managing the NAND flash memory 100. Operations of the controller 200, which will be described hereinafter, may be realized by the processor executing software (or firmware) or may be realized by hardware.

The NAND interface circuit 250 is coupled to the NAND flash memory 100 via the NAND bus to communicate with the NAND flash memory 100. The NAND interface circuit 250 transmits various signals to and receives various signals from the NAND flash memory 100 based on instructions received from the processor 230.

The buffer memory 240 temporarily holds write data and read data.

The built-in memory 220 is, for example, a semiconductor memory such as a DRAM or an SRAM, and is used as a work area of the processor 230. The built-in memory 220 holds firmware that allows the NAND flash memory 100 to be managed, various management tables, etc. The management table includes, for example, a latest access time table 221 for managing the latest access time to the NAND flash memory 100, an additional command table 222 for managing commands to additionally announce setting of conditions for a read operation, specific processing, etc. The built-in memory 220 holds reference value information 223. The reference value information 223 includes first reference value $\Delta t1$ and second reference value $\Delta t2$ ($\Delta t1 < \Delta t2$) of elapsed time period $\Delta t$ since the latest access. These tables 221 and 222 and the reference value information 223 will be described later in detail.

The ECC circuit 260 performs error detection and error correction processing on data stored in the NAND flash memory 100. Namely, the ECC circuit 260 generates an error correction code and provides write data with the error correction code when writing data, and decodes the error correction code when reading data.

The timer 270 is operable to retrieve current time, measure a time period associated with various operations of the memory system 1, and so on. The timer 270 may be located outside of the controller 200. In such a case, the timer 270 and the controller 200 are coupled together so that a measurement result retrieved by the timer 270 is transmitted to the controller 200.

1.1.3 Configuration of NAND Flash Memory 100
1.1.3.1 Overall Configuration of NAND Flash Memory 100

Next, a configuration of the NAND flash memory 100 will be described. As shown in FIG. 1, the NAND flash memory 100 includes a memory cell array 110, a row decoder 120, a driver circuit 130, a sense amplifier 140, an address register 150, a command register 160, and a sequencer 170.

The memory cell array 110 includes a plurality of blocks BLK, each including a plurality of non-volatile memory cells each associated with a row and a column. As an example, FIG. 1 shows four blocks BLK0 to BLK3. The memory cell array 110 stores data provided from the controller 200.

The row decoder 120 selects one of the blocks BLK0 to BLK3 based on block address BA within the address register 150, and further selects a row direction of the selected block BLK.

The driver circuit 130 supplies a voltage to the selected block BLK via the row decoder 120.

When reading data, the sense amplifier 140 senses data that is read from the memory cell array 110, and performs a necessary arithmetic operation. Then, the sense amplifier 140 outputs this data DAT to the controller 200. When writing data, the sense amplifier 140 transfers write data DAT received from the controller 200 to the memory cell array 110.

The address register 150 holds address ADD received from the controller 200. This address ADD includes block address BA mentioned above and page address PA. The command register 160 holds command CMD received from the controller 200.

The sequencer 170 controls operations of the entire NAND flash memory 100 based on various information held in the registers 150 and 160.

1.1.3.2 Configuration of Block BLK

Figure 2:
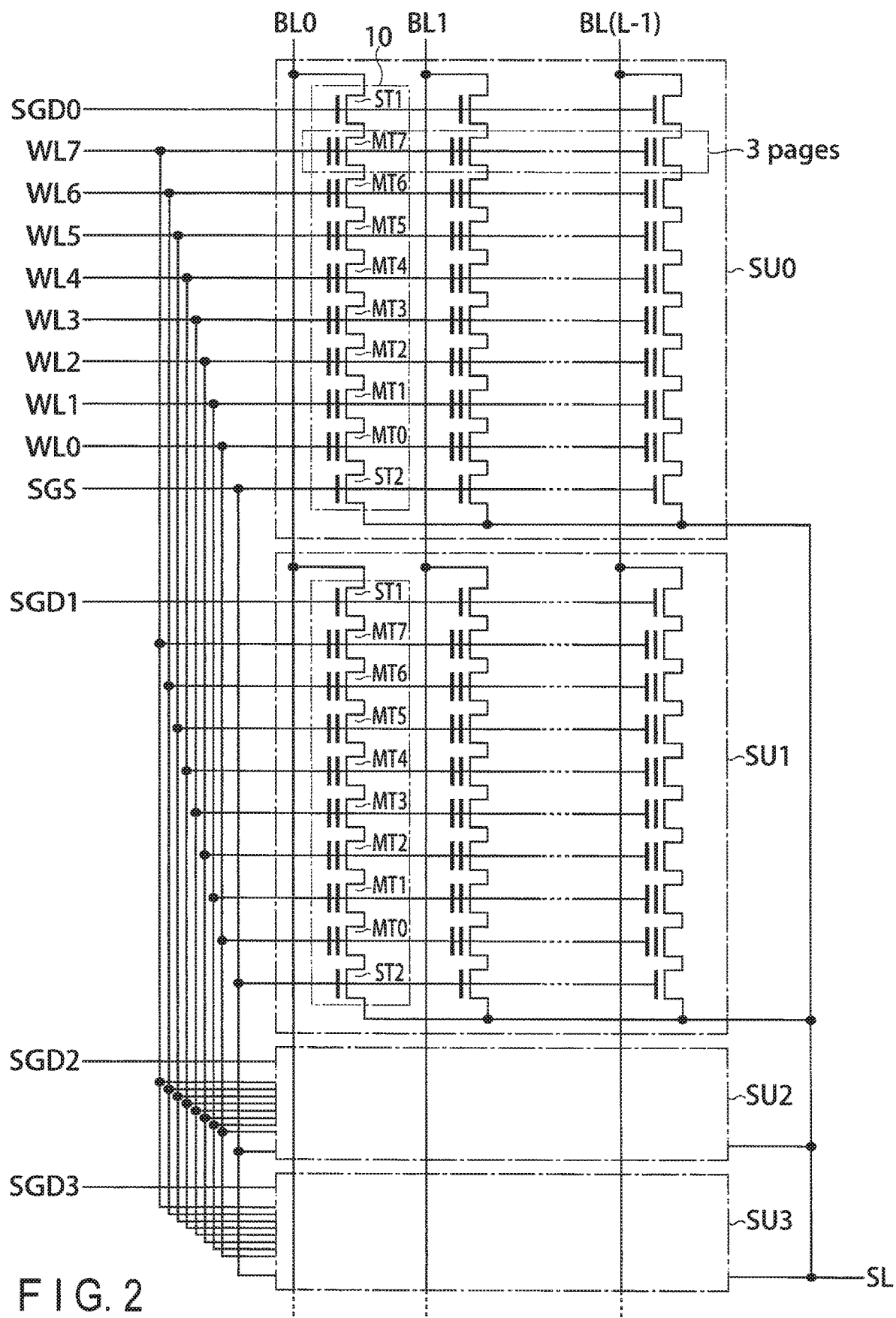
FIG. 2 is a circuit diagram of a block according to the first embodiment.

Next, a configuration of block BLK mentioned above will be described with reference to FIG. 2. As shown in FIG. 2, a block BLK includes, for example four string units SU (SU0 to SU3). Each string unit SU includes a plurality of NAND strings 10.

Each of the NAND strings 10 includes, for example, eight memory cell transistors MT (MT0 to MT7) and select transistors ST1 and ST2. Each memory cell transistor MT includes a control gate and a charge storage layer, and holds data in a nonvolatile manner. The memory cell transistors MT are coupled in series between a source of the select transistor ST1 and a drain of the select transistor ST2.

Gates of the select transistors ST1 in the string units SU0 to SU3 are coupled to select gate lines SGD0 to SGD3, respectively. On the other hand, gates of the select transistors ST2 in the string units SU0 to SU3 are coupled in common to, for example, select gate line SGS. The gates of the select transistors ST2 in the string units SU0 to SU3 may be coupled to the respective different select gate lines SGS0 to SGS3. Control gates of the memory cell transistors MT0 to MT7 in the same block BLK are coupled to word lines WL0 to WL7, respectively.

Drains of select transistors ST1 of the NAND strings 10 in the same column within the memory cell array 110 are coupled in common to a corresponding one of the bit lines BL (BL0 to BL(L−1), where (L−1) is a natural number equal to or larger than 2). Namely, each bit line BL couples the NAND strings 10 together in common among a plurality of blocks BLK. Moreover, sources of select transistors ST2 are coupled in common to the source line SL.

Namely, the string unit SU includes a plurality of NAND strings 10 coupled to different bit lines BL and coupled to the same select gate line SGD. Each block BLK includes a plurality of string units SU that share word lines WL. The memory cell array 110 includes a plurality of blocks BLK that share bit lines BL.

In the present embodiment, one memory cell transistor MT can hold, for example, 3-bit data. The bits of the 3-bit data will be referred to as a lower bit, a middle bit, and an upper bit in ascending order from the least significant bit. In one string unit SU, a set of lower bits held in memory cells coupled to the same word line WL will be referred to as a lower page, a set of middle bits will be referred to as a middle page, and a set of upper bits will be referred to as an upper page. In other words, three pages are allocated to a single word line WL. Therefore, "page" may also be defined as a part of a memory space formed by memory cells coupled to the same word line. Data is written and read in units of pages. In this example, one string unit SU has eight word lines; accordingly, each string unit SU has (3 pages× 8)=24 pages, and since each block BLK has four string units SU, each block has (24 pages×4)=96 pages.

Figure 3:
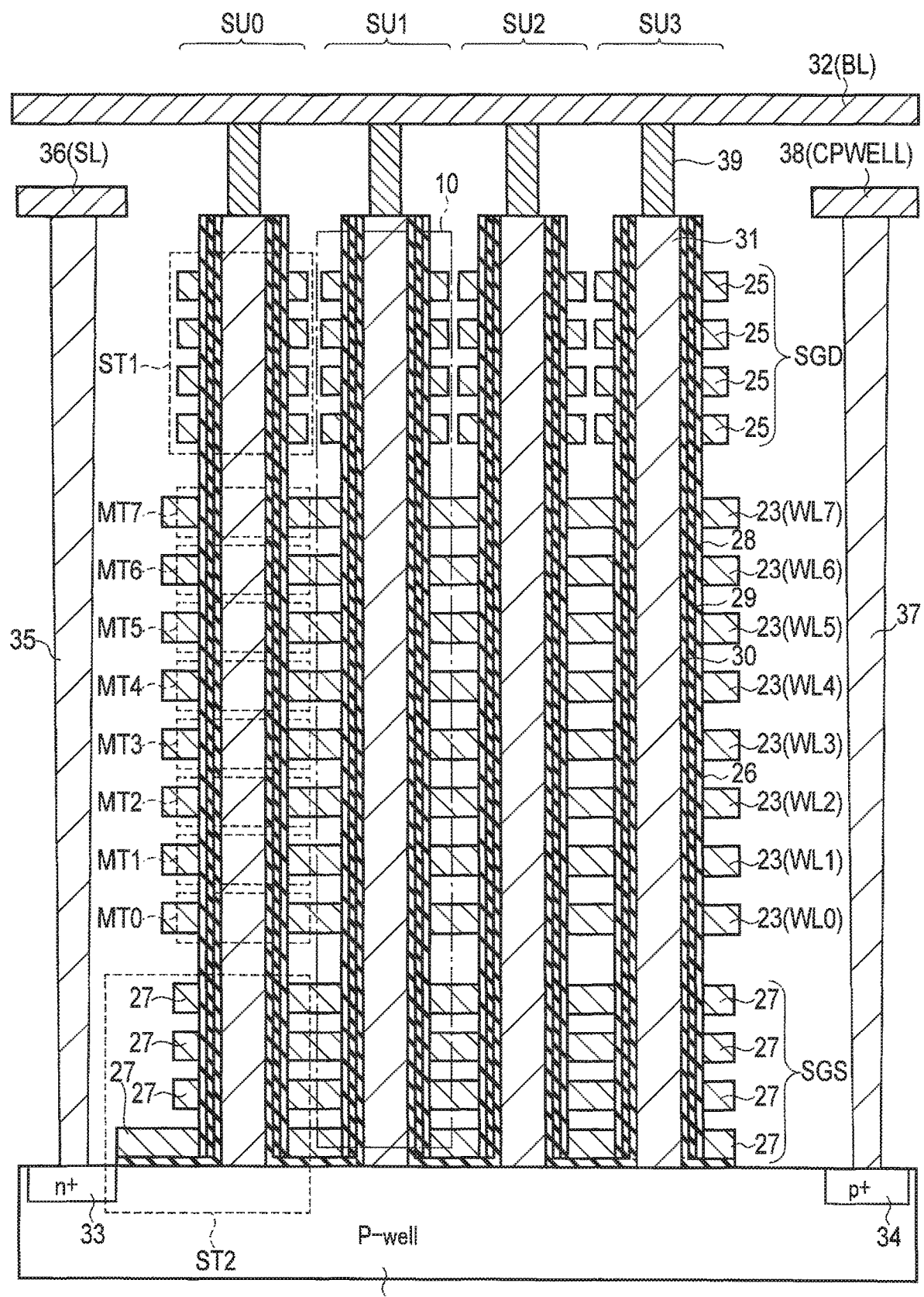
FIG. 3 is a cross-sectional view of the block according to the first embodiment.

FIG. 3 is a cross-sectional view of a partial region of block BLK. As shown in FIG. 3, a plurality of NAND strings 10 are formed above a p-type well region 20. Specifically, for example, four layers of interconnect layers 27 functioning as the select gate lines SGS, eight layers of interconnect layers 23 respectively functioning as the word lines WL0 through WL7, and for example, four layers of interconnect layers 25 functioning as the select gate lines SGD are sequentially stacked above the well region 20. Insulating films (not shown) are formed between the stacked interconnect layers.

A pillar-shaped conductor 31 extending through interconnect layers 25, 23, and 27 to reach the well region 20 is formed. A gate insulating film 30, a charge storage layer (insulating film) 29, and a block insulating film 28 are sequentially formed on the side surface of the conductor 31, thereby forming memory cell transistors MT and select transistors ST1 and ST2. The conductor 31 functions as a current path of each NAND string 10, and is used as a region in which a channel of each transistor is formed. The upper end of the conductor 31 is coupled via a contact plug 39 to a metal interconnect layer 32 that functions as bit line BL.

In a surface region of the well region 20, an $n^+$-type impurity diffusion layer 33 is formed. A contact plug 35 is formed above the diffusion layer 33, and is coupled to a metal interconnect layer 36 that functions as a source line SL. In the surface region of the well region 20, a $p^+$-type impurity diffusion layer 34 is also formed. A contact plug 37 is formed above the diffusion layer 34, and is coupled to a metal interconnect layer 38 that functions as a well interconnect CPWELL. The well interconnect CPWELL is used to apply a potential to the conductor 31 via the well region 20.

A plurality of structures described above are arranged in the depth direction of the sheet of FIG. 3, and a set of NAND strings 10 aligned in the depth direction forms one string unit SU.

Figure 4:
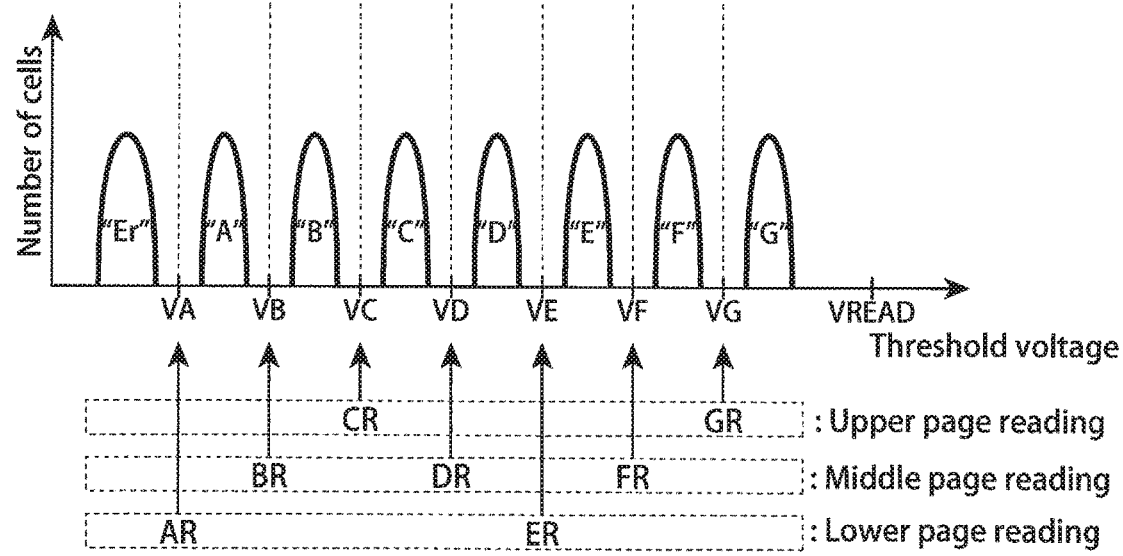
FIG. 4 is a graph showing threshold distributions of memory cells according to the first embodiment.

FIG. 4 is a diagram showing storable data, a threshold distribution, and a read voltage for each memory cell transistor MT.

As shown in FIG. 4, each memory cell transistor MT can take eight states depending on a threshold voltage. Those eight states will be referred to as state "Er", state "A", state "B", state "C", . . . , and state "G" in ascending order of threshold voltage.

A threshold voltage of a memory cell transistor MT in state "Er" is less than voltage VA, and state "Er" corresponds to a data-erased state. A threshold voltage of a memory cell transistor MT in state "A" is voltage VA or more and less than voltage VB (>VA). A threshold voltage of a memory cell transistor MT in state "B" is voltage VB or more and less than voltage VC (>VB). A threshold voltage of a memory cell transistor MT in state "C" is voltage VC or more and less than voltage VD (>VC). A threshold voltage of a memory cell transistor MT in state "D" is voltage VD or more and less than voltage VE (>VD). A threshold voltage of a memory cell transistor MT in state "E" is voltage VE or more and less than voltage VF (>VE). A threshold voltage of a memory cell transistor MT in state "F" is voltage VF or more and less than voltage VG (>VF). A threshold voltage of a memory cell transistor MT in state "G" is voltage VG or more and less than voltage VREAD. Of the eight states accordingly distributed, state "G" is the highest threshold voltage state. Note that voltage VREAD is a voltage applied to a non-selected word line in a read operation, and turns on each memory cell transistor MT regardless of held data.

The above-described threshold distribution is obtained by writing 3-bit (3-page) data constituted by the above-mentioned lower bit, middle bit, and upper bit. The eight states described above have the following relationship with the lower bit, middle bit, and upper bit:

State "Er": "111" (in the order of "upper/middle/lower")
State "A": "110"
State "B": "100"
State "C": "000"
State "D": "010"
State "E": "011"
State "F": "001"
State "G": "101"

In the threshold distributions, adjacent two states are different only in one of three bits composing their corresponding data.

Accordingly, reading of the lower bit only requires usage of a voltage corresponding to a boundary in which the value ("0" or "1") of the lower bit varies; this also applies to reading of the middle bit and reading of the upper bit.

That is, as shown in FIG. 4, reading of the lower page uses as a read voltage, voltage VA which distinguishes between states "Er" and "A", and voltage VE which distinguishes between states "D" and "E". Read operations using voltages VA and VE will be referred to as read operations AR and ER, respectively.

Reading of the middle page uses as a read voltage, voltage VB which distinguishes between states "A" and "B", voltage VD which distinguishes between states "C" and "D", and voltage VF which distinguishes between states "E" and "F". Read operations using voltages VB, VD, and VF will be referred to as read operations BR, DR, and FR, respectively.

Reading of the upper page uses as a read voltage, voltage VC which distinguishes between states "B" and "C", and voltage VG which distinguishes between states "F" and "G". Read operations using voltages VC and VG will be referred to as read operations CR and GR, respectively.

Data erasing is performable in units of blocks BLK, or smaller units. The erasing method is described in, for example, U.S. patent application Ser. No. 13/235,389, entitled "NONVOLATILE SEMICONDUCTOR MEMORY DEVICE", filed on Sep. 18, 2011. The method is also described in U.S. patent application Ser. No. 12/694,690, entitled "NON-VOLATILE SEMICONDUCTOR STORAGE DEVICE", filed on Jan. 27, 2010. Furthermore, the method is described in U.S. patent application Ser. No. 13/483,610, entitled "NONVOLATILE SEMICONDUCTOR MEMORY DEVICE AND DATA ERASE METHOD THEREOF", filed on May 30, 2012. These patent applications are incorporated herein in their entirety by reference.

The memory cell array 110 may have other configurations. That is, a configuration of the memory cell array 110 is described in, for example, U.S. patent application Ser. No. 12/407,403, entitled "THREE DIMENSIONAL STACKED NONVOLATILE SEMICONDUCTOR MEMORY", filed on Mar. 19, 2009. The configuration of the memory cell array 110 is also described, for example, in U.S. patent application Ser. No. 12/406,524 entitled "THREE DIMEN- SIONAL STACKED NONVOLATILE SEMICONDUCTOR MEMORY" filed on Mar. 18, 2009, U.S. patent application Ser. No. 12/679,991 entitled "NON-VOLATILE SEMICONDUCTOR STORAGE DEVICE AND METHOD OF MANUFACTURING THE SAME" filed on Mar. 25, 2010, and U.S. patent application Ser. No. 12/532,030 entitled "SEMICONDUCTOR MEMORY AND METHOD FOR MANUFACTURING THE SAME" filed on Mar. 23, 2009. These patent applications are incorporated herein in their entirety by reference.

1.1.4 Latest Access Time Table 221

Next, a latest access time table 221 according to the present embodiment will be described. As described above, the controller 200 holds the table 221 in the memory 220, for example.

The table 221 holds, for example, for each block BLK, the latest access time issued by the controller 200. The concept of the table 221 will be described with reference to FIG. 5. FIG. 5 is a conceptual diagram of an example of the table 221.

As shown in FIG. 5, the table 221 includes a plurality of entries (in the example of FIG. 5, four entries). Each entry holds physical block address BA (simply referred to as physical address BA) and latest access time to block BLK corresponding to this particular physical address BA. In the example shown in FIG. 5, the latest access time to block BLK assigned with physical address BA0 is TIME_0. The latest access time to block BLK assigned with physical address BA1 is TIME_1. The latest access time to block BLK assigned with physical address BA3 is TIME_3.

TIME_0, TIME_1, and TIME_3 include date and time information such as Jan. 1, 2019, 00:00:00. In the example shown in FIG. 5, no latest access time is set for physical address BA2. This means that block BLK assigned with physical address BA2 has not been accessed since power-on.

In the table 221, "access" indicates data reading or writing with respect to block BLK. The latest access time indicates time when a read command or write command with respect to block BLK concerned is transmitted from the controller 200 to the NAND flash memory 100 via the NAND bus. More specifically, the latest access time indicates time when a command is output from, for example, the NAND interface circuit 250 to the NAND bus. The latest access time is not limited to the above, and may be various points of time associated with command issuance, such as time when the processor 230 within the controller 200 orders the NAND interface circuit 250 to issue a command.

Described with reference to FIG. 5 was the example in which the table 221 holds information on unaccessed block BLK, too, such as physical address BA2. However, the controller 200 may be configured to hold information on accessed block BLK without holding information on unaccessed block BLK. In such a case, at the timing when block BLK is accessed for the first time, the controller 200 may add an entry to the table 221 to store therein the latest access time with respect to this accessed block BLK.

1.1.5 Additional Command Table 222

Next, the additional command table 222 according to the present embodiment will be described. As described above, the controller 200 holds the table 222 within the memory 220, for example.

When reading data from a certain block BLK, the controller 200 adds an additional command to a normal read command sequence, in accordance with elapsed time period Δt since the latest access to this block BLK. The table 222 holds a relation between the elapsed time period Δt and an additional command to be added. A concept of the table 222 will be described with reference to FIG. 6. FIG. 6 is a conceptual diagram of an example of the table 222.

As shown in FIG. 6, the table 222 includes a plurality of entries (three entries in the example of FIG. 6). Each entry holds elapsed time period Δt since the latest access and an additional command to be added to a normal read command sequence in accordance with the elapsed time period Δt. In the example shown in FIG. 6, when elapsed time period Δt is less than reference value Δt1, additional command CMD_T is added. When elapsed time period Δt is reference value Δt1 or more and reference value Δt2 or less, no additional command is added. When elapsed time period Δt is more than reference value Δt2, additional command CMD_T is added. Reference values Δt1 and Δt2 are information to be included in the aforementioned reference value information 223. Command CMD_T is a command for controlling a read voltage. This will be described in detail in item 1.2 later.

The table 222 configured as described above and the reference value information 223 are held in, for example, any block BLK in the NAND flash memory 100. The table 222 and the reference value information 223 are read by the controller 200, for example, immediately after the power is turned on, and held in the memory 220, etc.

1.2 Read and Write Operations

Next, data read and write operations according to the present embodiment will be described.

1.2.1 Operation of Controller 200

Figure 7:
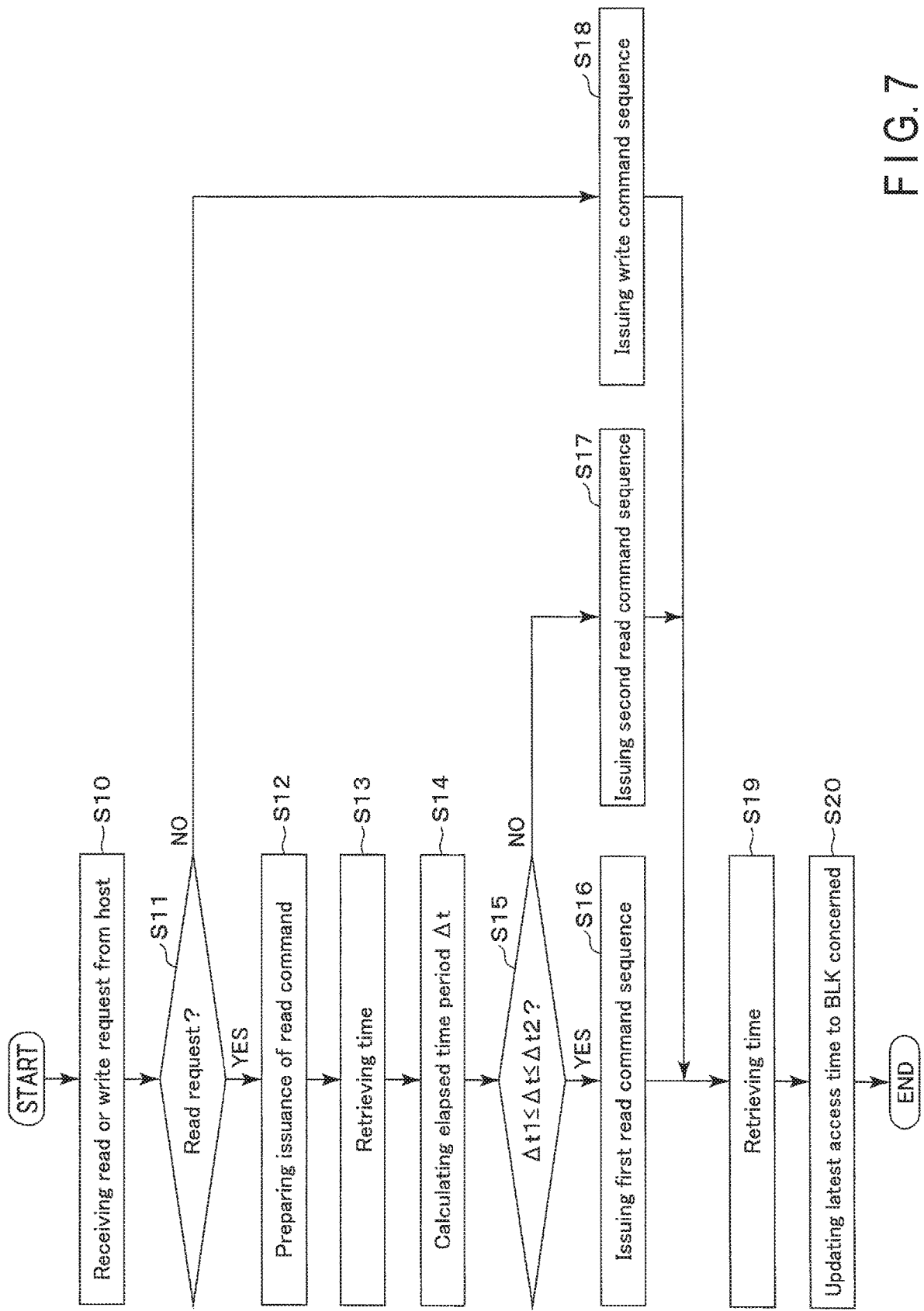
FIG. 7 is a flowchart of read and write operations according to the first embodiment.

First, operations of the controller 200 will be described. FIG. 7 is a flowchart showing how the controller 200 operates when performing read and write operations.

As shown in FIG. 7, the host interface circuit 210 of the controller 200 receives a read or write request from the host device 300 (step S10). The processor 230, for example, of the controller 200 then determines whether or not the received request is a read request (step S11).

If the request received from the host device 300 is a read request (YES in step S11), in response to the read request, the processor 230, for example, of the controller 200 prepares to issue a read command by performing internal processing (step S12). Examples of internal processing include conversion of a logical address received from the host device 300 into a physical address.

When completing the preparation for issuance of the read command, the processor 230, for example, of the controller 200 retrieves current time from the timer 270 (step S13). The processor 230 then calculates elapsed time period Δt since the latest access to block BLK as an object to be accessed (step S14). Specifically, the processor 230 calculates elapsed time period Δt based on a difference between the latest access time with respect to physical address BA retrieved at step S12 and the time retrieved by the timer 270. The latest access time is retrieved from the table 221 described above.

Next, the processor 230, for example, of the controller 200 compares elapsed time period Δt with reference values Δt1 and Δt2 (step S15). If the comparison result shows that elapsed time period Δt is reference value Δt1 or more and reference value Δt2 or less (YES in step S15), the processor 230, for example, of the controller 200 orders the NAND interface circuit 250 to issue a first read command sequence based on the aforementioned table 222. Based on this order, the NAND interface circuit 250 issues the first read command sequence (step S16).

The first read command sequence is a normal command sequence that contains no additional command. An example of the first read command sequence exemplified is presented as follows:

<00h> <ADD> <ADD> <ADD> <ADD> <ADD> <30h>

Namely, address input is announced by command "00h", and address ADD is input over five cycles. This address ADD designates block BLK and a page as objects to be read. When command "30h" is input, the sequencer 170 starts data reading from a memory cell, and the NAND flash memory 100 goes into a busy state. A busy state means a state in which the NAND flash memory 100 is incapable of receiving any normal command (commands other than an interrupt command) from outside. A ready state means a state in which the NAND flash memory 100 is capable of receiving a normal command.

Subsequently, the processor 230, for example, of the controller 200 retrieves from the timer 270, time when the first read command sequence is transmitted from the controller 200 to the NAND bus (step S19). The processor 230, for example, of the controller 200 updates the latest access time which, in the table 221, corresponds to the retrieved physical address BA, to the time retrieved at step S19 (step S20).

If the result of step S15 shows that elapsed time period Δt is less than reference value Δt1 or more than reference value Δt2 (NO in step S15), the processor 230, for example, of the controller 200 orders the NAND interface circuit 250 to issue a second read command sequence including an additional command based on the table 222. Based on this order, the NAND interface circuit 250 issues the second read command sequence (step S17).

An example of the second read command sequence is presented below:
<XXh><00h><ADD><ADD><ADD><ADD><ADD><30h>
Namely, additional command "XXh" is added to the head of the first read command sequence. "XXh" announces an order to shift a read voltage from a default value. Thereafter, the operations in steps S19 and S20 described above are executed.

If the request received from the host device 300 is a write request (NO in step S11), in response to the write request, the processor 230, for example, of the controller 200 performs internal processing necessary for the write operation, and the NAND interface circuit 250 issues a write command sequence (step S18).

An example of the write command sequence is presented below:
<80h><ADD><ADD><ADD><ADD><ADD><DAT> <DAT> . . . <10h>
Namely, address input is announced by command "80h", and address ADD is input over five cycles. This address ADD designates block BLK and a page as objects to be written. When write data DAT is input and then command "10h" is input, the sequencer 170 starts data writing to a memory cell, and the NAND flash memory 100 goes into a busy state. Then, steps S19 and S20 described above are executed at the timing when the write command sequence is transmitted from the controller 200 to the NAND bus.

1.2.2 Operation of NAND Flash Memory 100

Described next is an operation of the NAND flash memory 100 at the time of the read operation. Hereinafter, a case of reading middle-page data will be descried as an example.

<Case of Read Command Sequence without Additional Command "XXh">

Figure 8A:
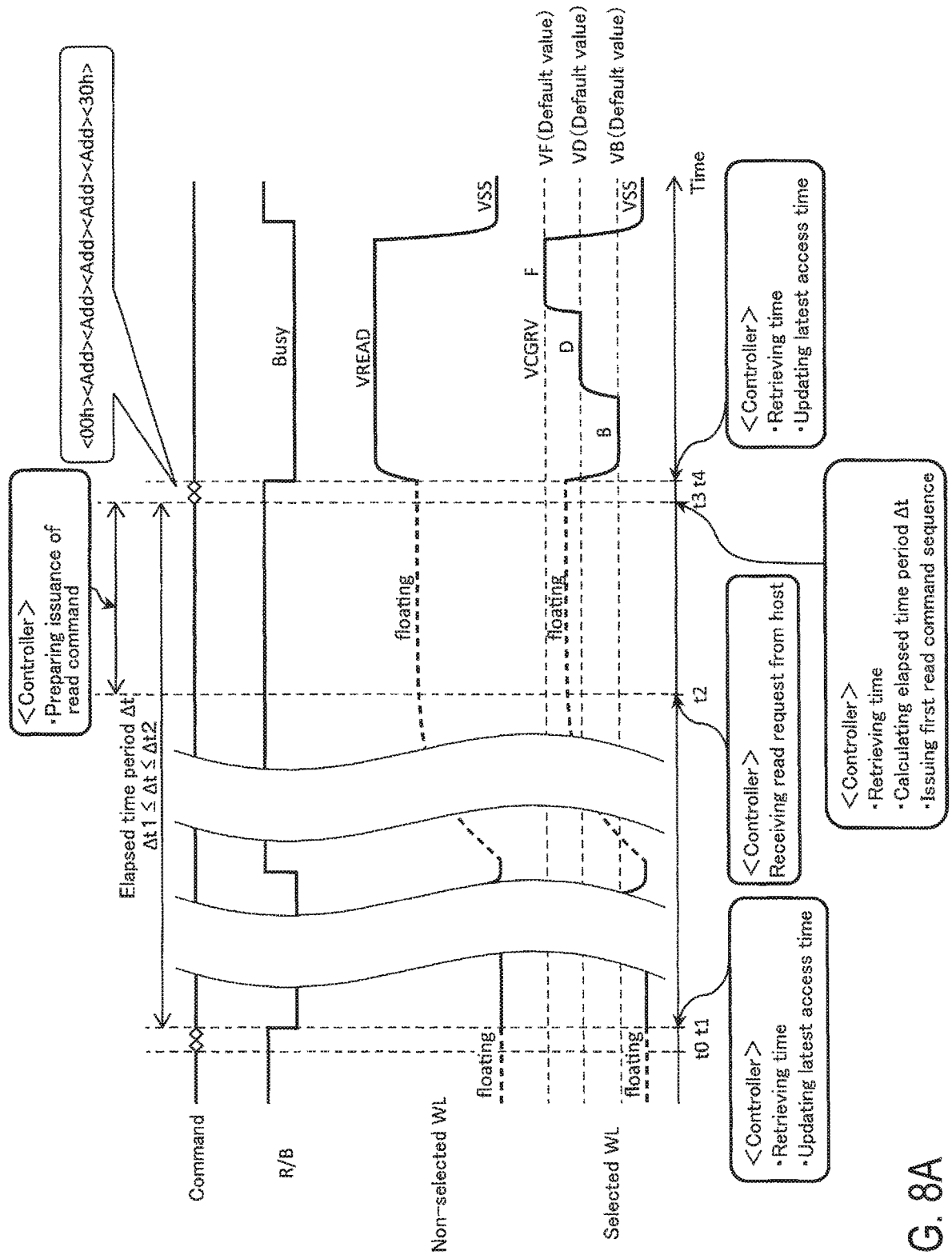
FIGS. 8A and 8B are each a timing chart of a command sequence and various signals during a read operation according to the first embodiment.

First, described with reference to FIG. 8A is an operation of the NAND flash memory 100 when the controller 200 does not issue additional command "XXh", that is, the controller 200 issues the first read command sequence. FIG. 8A is a timing chart of a command, ready/busy signal R/B, non-selected word line WL voltage, and selected word line WL voltage. FIG. 8A schematically shows <00h> and <30h> as a command obtained by excluding the address from the first read command sequence <00h><ADD><ADD><ADD><ADD><ADD><30h>. In FIG. 8A, operations of the NAND flash memory 100 are executed under control of the sequencer 170, for example.

As shown in FIG. 8A, assume that the controller 200 issues a write or read command sequence with respect to block BLK1 at time t0, and then issues a read command sequence again with respect to block BLK1 at time t3. If elapsed time period Δt from time t1 to time t3 is reference value Δt1 or more and reference value Δt2 or less, the controller 200 issues the first read command sequence that contains no additional command "XXh".

Upon receipt of the first read command sequence at time t4, the NAND flash memory 100 holds received addressed ADD in the address register 150, holds received command CMD in the command register 160, and goes into the busy state. Based on block address BA within the address register 150, the row decoder 120 selects block BLK1, and further selects any word line WL of the selected block BLK1.

The driver circuit 130 supplies a voltage to the selected block BLK1 via the row decoder 120. Specifically, the driver circuit 130 applies read voltage VCGRV to the selected word line WL, and applies voltage VREAD to the non-selected word line WL. Voltage VCGRV is a value to be used as reference in reading data from a memory cell coupled to the selected word line. Whether held data is "0" or "1" depends on whether the memory cell is turned on or not when voltage VCGRV is applied thereto. To read the middle-page data, as described above with reference to FIG. 4, read operations BR, DR, and FR are executed. When the first read command sequence is issued, the driver circuit 130 generates voltages VB, VD, and VF as voltage VCGRV. Those voltages are default read voltages in executing read operations BR, DR, and FR, respectively. Voltage VREAD is a voltage that turns on a memory cell regardless of held data.

Data is read to the bit line BL from the memory cell transistor MT coupled to the selected word line WL, and the read data is sensed by the sense amplifier 140, thereby being stored in an internal latch circuit.

In FIG. 8A, the steps explained with reference to FIG. 7 are executed by the controller 200 in a manner to execute step S10 at time t2, steps S11 and S12 from time t2 to time t3, steps S13 to S16 at time t3, and steps S19 and S20 at time t4.

<Case of Read Command Sequence Containing Additional Command "XXh">

Figure 8B:
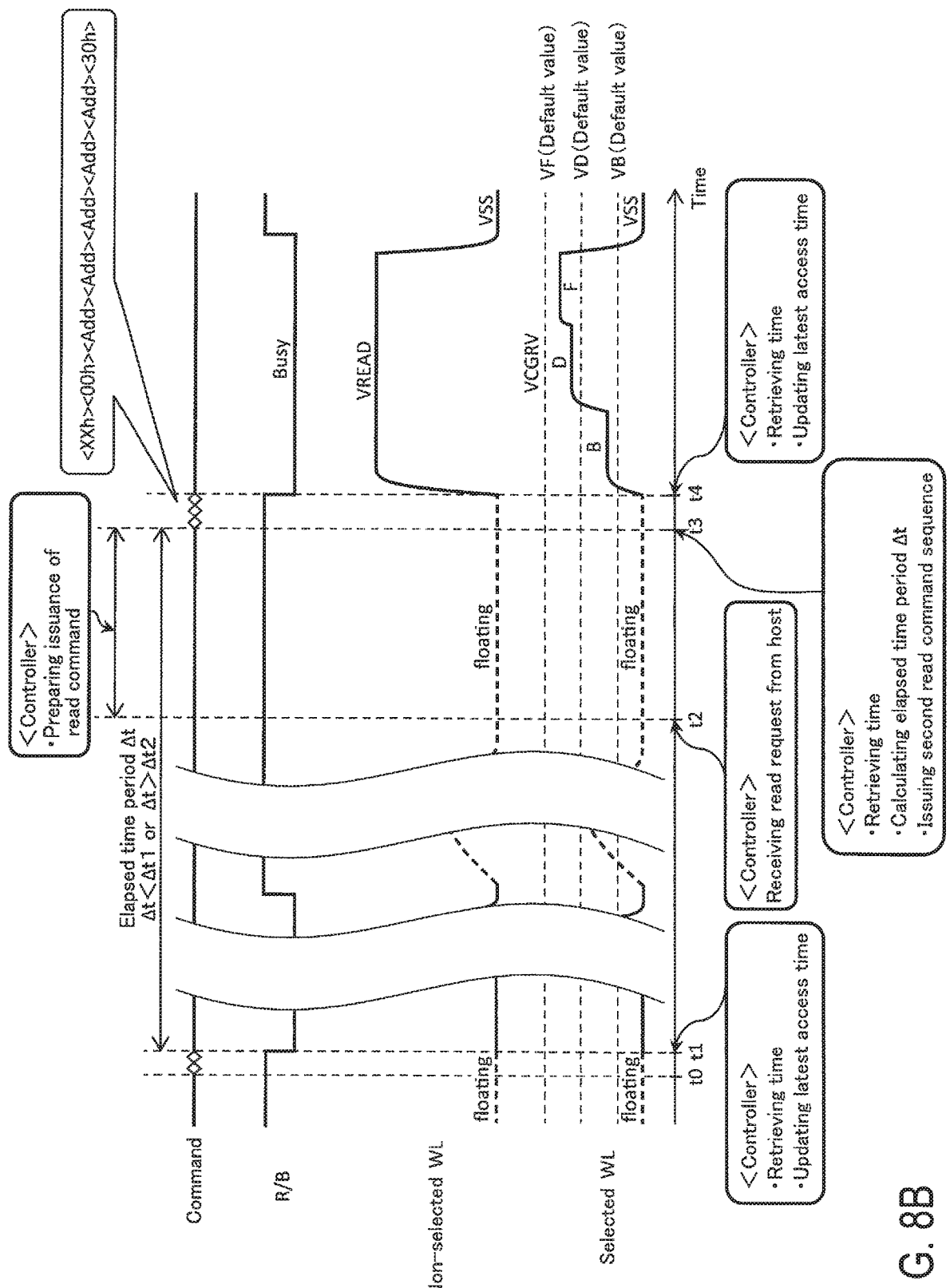

Next, a case in which the controller 200 issues the second read command sequence including additional command "XXh" will be described with reference to FIG. 8B. As is the case for FIG. 8A, FIG. 8B is also a timing chart of a command, ready/busy signal R/B, non-selected word line WL voltage, and selected word line WL voltage. Hereinafter, only differences from FIG. 8A will be described. FIG. 8B schematically shows <XXh>, <00h>, and <30h> as a command obtained by excluding the address from the second read command sequence <XXh><00h><ADD><ADD><ADD><ADD><ADD><30h>.

As shown in FIG. 8B, if elapsed time period Δt from time t1 to time t3 is less than reference value Δt1 or reference value Δt2 or more, the controller 200 issues the second read command sequence that contains additional command "XXh".

Then, the sequencer 170 retrieves shift amount ΔV of read voltage VCGRV from any of registers (not shown) based on the additional command within the command register 160. Shift amount ΔV mentioned above is held as, e.g., a table (referred to as a shift amount table) together with a default value of voltage VCGRV in a ROM fuse within the memory cell array 110, for example. When the NAND flash memory 100 is powered on, the sequencer 170 reads shift amount ΔV to a register with no need for an order from the controller 200. For example, a concept of the shift amount table showing shift amount ΔV is as illustrated in FIG. 9. Shift amount ΔV is prepared for each of read operations AR, BR, . . . , and GR. Hereinafter, shift amounts prepared for read operations AR, BR, . . . , and GR will be referred to as ΔVA, ΔVB, . . . , and ΔVG, respectively.

The driver circuit 130 applies to the selected word line WL, as read voltage VCGRV, a voltage of value obtained by adding shift amount ΔV retrieved by the sequencer 170 to each of default voltages VB, VD, and VF when reading. For the upper and lower pages, read voltage VCGRV is shifted in a similar manner. The remaining operations of the NAND flash memory 100 are the same as those shown in FIG. 8A. FIGS. 8A and 8B show the example in which middle-page data is read in the order of BR, DR, and FR; however, the order of reading is not limited to this. Middle-page data may be read in the order of FR, DR, and BR, or any other order. The same applies to the order of reading lower-page data and to the order of reading upper-page data.

1.3 Advantageous Effect of Present Embodiment

The configuration according to the present embodiment achieves an improvement of the memory system 1 in terms of operation reliability. This advantageous effect will be described below.

The threshold distributions corresponding to states "Er", "A", . . . , and "G" described in relation to FIG. 4 are apart from one another. This allows the states to be distinguished from one another by voltages VA, VB, . . . , and VG. However, depending on elapsed time period Δt after data reading or writing, capacitance coupling between a channel region of a memory transistor MT and a word line WL may raise a voltage of word line WL, thereby shifting a threshold voltage of a memory cell transistor MT.

For example, if elapsed time period Δt is reference value Δt1 or more and reference value Δt2 or less, as shown in FIG. 8A, a voltage of word line WL, which has dropped down to VSS, rises by time t3. The shifted threshold voltage is restored after a certain time period. For example, if elapsed time period Δt is more than reference value Δt2, a voltage of word line WL, which has risen, drops down to VSS by time t3, as shown in FIG. 8B.

To be more specific, if elapsed time period Δt described above is less than a certain time period (reference value Δt1), or is more than another certain time period (reference value Δt2), capacitance coupling has a small influence, and the threshold voltage is shifted by a small amount or is not shifted. In the present embodiment, this state is referred to as the first state. On the other hand, if elapsed time period Δt described above falls within a certain time period (equal to or more than reference value Δt1 and equal to or less than reference value Δt2), capacitance coupling has a significant influence, and the threshold voltage is shifted by a large amount. In the present embodiment, this state is referred to as the second state.

A shift direction of each threshold voltage in the second state varies depending on a threshold voltage of a memory cell transistor MT. This is illustrated in FIG. 10A. FIG. 10A shows how each threshold voltage fluctuates. In FIG. 10A, each threshold distribution not yet shifted is indicated by the broken line, and each threshold distribution already shifted is indicated by the solid line. Each shift direction is indicated by an arrow. As shown in FIG. 10A, threshold voltages that are relatively low (for example, states "Er" to "D") shift toward the high voltage side. On the other hand, threshold voltages are relatively high (for example, states "E" to "G") shift toward the low voltage side.

As a result, overlap may occur between adjacent threshold distributions in the second state. This may cause difficulty in reading data with accuracy using aforementioned voltages VA, VB, . . . , and VG. As a countermeasure, one option is to set a default read voltage to an optimal value for the second state. However, this may increase the number of fail bits (the number of bits reading of which ends in failure) in the first state. That is, it may be difficult to perform appropriate reading in both the first and second states.

Therefore, the present embodiment is configured in a manner that the controller 200 includes the timer 270, and that the memory 220, for example, of the controller 200 holds the latest access time table 221, the additional command table 222, and the reference value information 223 that contains reference values Δt1 and Δt2. Reference values Δt1 and Δt2 are set in consideration of the first and second states. Furthermore, the present embodiment is configured in a manner such that a default read voltage is optimized for the second state.

The controller 200 determines based on the timer 270, the table 221, and reference values Δt1 and Δt2, whether a voltage of the selected word line WL is in the first state or the second state.

If elapsed time period Δt is reference value Δt1 or more and reference value Δt2 or less, the processor 230 determines that a voltage of the selected word line WL is in the second state. In this case, the shift amount of threshold voltage is large, as described above. However, since a default read voltage is optimized for the second state, the controller 200 issues, based on the table 222, the first read command sequence that contains no additional command "XXh". As a result, the NAND flash memory 100 performs a read operation using default read voltage VCGRV (=VA, VB, . . . , and VG). This achieves a reduction in the number of fail bits in the read operation.

On the other hand, if elapsed time period Δt is less than reference value Δt1 or more than reference value Δt2, the processor 230 determines that a voltage of the selected word line WL is in the first state. In this case, the shift amount of threshold voltage is small, as described above. However, if a read operation is performed using default read voltage VCGRV, the number of fail bits increases because a voltage value is optimized for the second state, not the first state.

In this respect, the present embodiment is configured in a manner such that the controller 200 issues additional command "XXh" based on the table 222 to order shifting of a read voltage. Namely, upon receipt of this order, the NAND flash memory 100 shifts read voltage VCGRV.

Specifically, the driver circuit 130 applies to the selected word line WL, as read voltage VCGRV, a voltage of a value obtained by adding shift amount ΔV retrieved by the sequencer 170 based on an additional command, to a default read voltage. Shift amount ΔV is set to an appropriate value for a read operation in the first state in consideration of a shift direction of a threshold voltage shown in FIG. 10A. Therefore, if a threshold voltage shifts toward the low voltage side under the influence of capacitance coupling described above, shift amount ΔV to be applied in the first state takes a negative value. If a threshold voltage shifts toward the high voltage side under the influence of capacitance coupling, shift amount ΔV to be applied in the first state takes a positive value.

That is, in the first state, positive shift amounts ΔVA, ΔVB, ΔVC, and ΔVD are applied to read voltages for read operations AR, BR, CR, and DR, for example. Shift amounts ΔVA, ΔVB, ΔVC, and ΔVD may take the same value. Negative shift amounts ΔVE, ΔVF, and ΔVG are applied to read voltages for read operations ER, FR, and GR. Shift amounts ΔVE, ΔVF, and ΔVG may take the same value.

As a result, in the first state, more appropriate read voltage VCGRV (=VA', VB', . . . , and VG') is used for each of threshold voltages at the time of reading, so that the number of fail bits can be reduced. This is illustrated in FIG. 10B. In FIG. 10B, the horizontal axis indicates elapsed time period Δt by a logarithm. Constant use of a read voltage optimized for the second state increases the number of fail bits in the first state (a period in which elapsed time period Δt is short (less than reference value Δt1) and a period in which elapsed time period Δt is long (more than reference value Δt2)), as indicated with the broken line of FIG. 10B. On the other hand, the configuration according to the present embodiment reduces the number of fail bits in the first state, as indicated by the solid line in FIG. 10B. This achieves improved reliability of the read operation, thereby reducing deterioration of reading performance caused by repetition of retry read.

2. Second Embodiment

A memory system according to the second embodiment will be described. Described in the above first embodiment was the case in which a default value of read voltage VCGRV is optimized for the second state. In contrast, the present embodiment relates to the case in which a default value of read voltage VCGRV is optimized for the first state. In the following description, only the matters different from the first embodiment will be described.

2.1 Additional Command Table 222

The additional command table 222 according to the present embodiment will be described. Referring to FIG. 6 described in the first embodiment, the table 222 according to the present embodiment holds information indicating that no additional command is added if elapsed time period Δt is less than reference value Δt1 or more than reference value Δt2 and that additional command CMD_T is added if elapsed time period Δt is reference value Δt1 or more and reference value Δt2 or less. That is, an additional command is issued under the condition opposite to that in the first embodiment.

2.2 Operation of Controller 200

Figure 11:
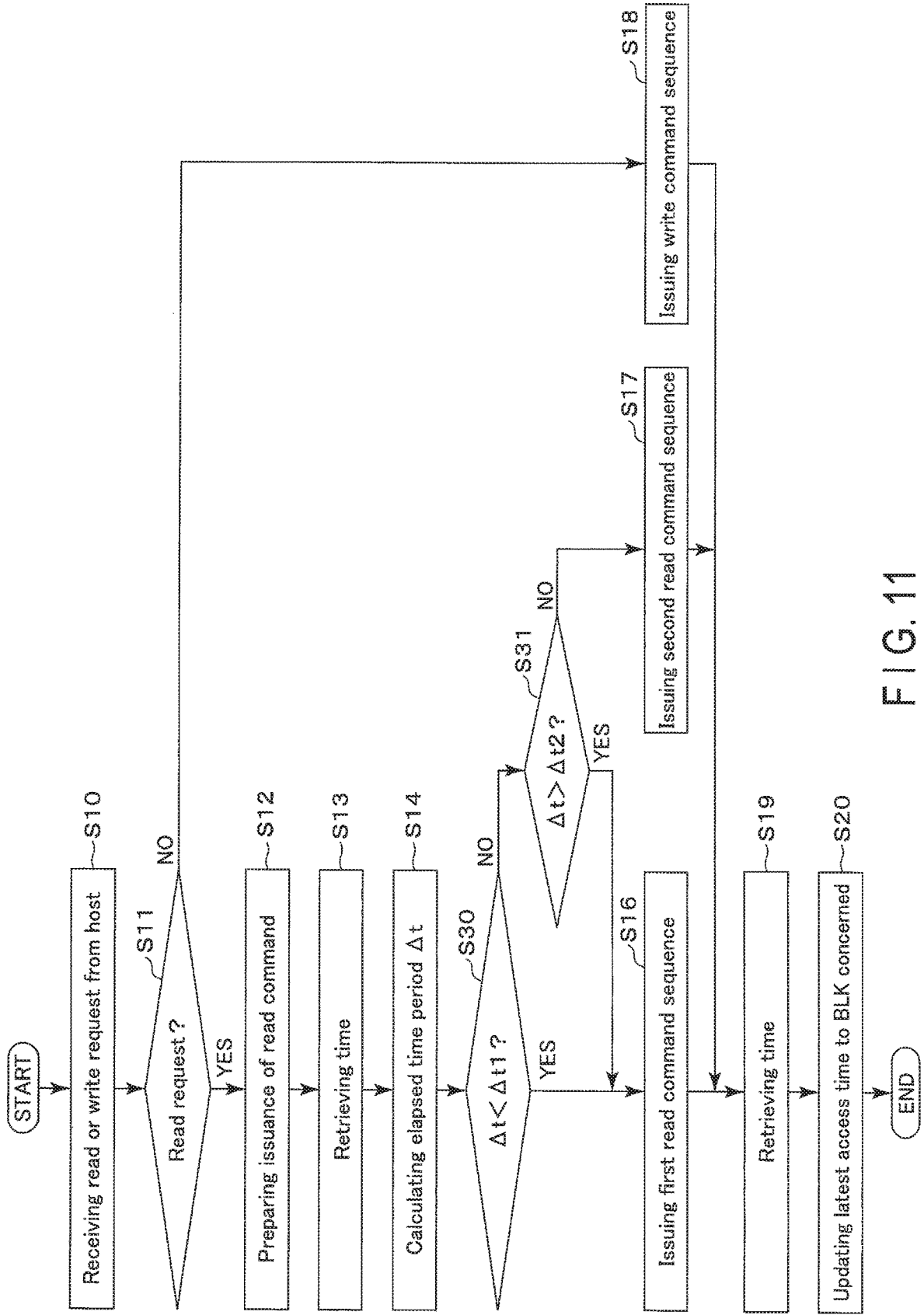
FIG. 11 is a flowchart of read and write operations according to the second embodiment.

Next, operations of the controller 200 will be described. FIG. 11 is a flowchart showing how the controller 200 operates when performing read and write operations according to the present embodiment.

As shown in FIG. 11, the operations according to the present embodiment differ from those described with reference to FIG. 7 in the first embodiment, in that if a comparison result between elapsed time period Δt and reference values Δt1 and Δt2 shows that elapsed time period Δt is less than reference value Δt1 (YES in step S30) and shows that elapsed time period Δt is more than reference value Δt2 (YES in step S31), the NAND interface circuit 250 issues the first read command sequence (step S16). Furthermore, if elapsed time period Δt is reference value Δt1 or more and reference value Δt2 or less (NO in step S30 and NO in step S31), the NAND interface circuit 250 issues the second read command sequence (step S17). The remaining operations of the controller 200 are the same as those shown in FIG. 7.

2.3 Advantageous Effect of Present Embodiment

The configuration according to the present embodiment achieves an improvement of the memory system 1 in terms of operation reliability. This advantageous effect will be described below.

In the first embodiment, default read value VCGRV is optimized for the second state. However, default read value VCGRV may be optimized for the first state as in the present embodiment. However, this may increase the number of fail bits in the second state.

Accordingly, the present embodiment is configured in a manner such that default read voltage VCGRV is optimized for the first state, and that the controller 200 issues the second read command sequence including an additional command in the second state. As in the first embodiment, shift amount ΔV of read voltage VCGRV is set to an appropriate value for a read operation in the second state in consideration of a shift direction of a threshold voltage. Therefore, shift amount ΔV is opposite to that in the first embodiment.

That is, in the second state, negative shift amounts ΔVA, ΔVB, ΔVC, and ΔVD are applied to read voltages for read operations AR, BR, CR, and DR, for example. Positive shift amounts ΔVE, ΔVF, and ΔVG are applied to read voltages for read operations ER, FR, and GR.

As a result, in the second state, a more appropriate voltage is used for each of threshold voltages at the time of reading, so that the number of fail bits can be reduced.

This is illustrated in FIG. 12. Constant use of a read voltage optimized for the first state increases the number of fail bits in the second state (in which elapsed time period Δt is reference value Δt1 or more and reference value Δt2 or less), as indicated with the broken line of FIG. 12. On the other hand, the configuration according to the present embodiment reduces the number of fail bits in the second state, as indicated by the solid line in FIG. 12. This achieves the improved read reliability as in the first embodiment.

3. Third Embodiment

A memory system according to the third embodiment will be described. The present embodiment differs from the above-described first embodiment in that shift amount ΔV of read voltage VCGRV is designated by the second read command sequence. In the following description, only the matters different from the first embodiment will be described.

3.1 Additional Command Table 222

The additional command table 222 according to the present embodiment will be described. As shown in FIG. 13, the table 222 according to the present embodiment holds shift amount ΔV to be applied to the block BLK concerned, in addition to the information held by the table 222 described in the first embodiment with reference to FIG. 6.

To be specific, in the example shown in FIG. 13, if elapsed time period Δt is less than reference value Δt1 or more than reference value Δt2, data DATA_T is added along with additional command CMD_T. Data DATA_T indicates shift amount ΔV to be applied to read voltage VCGRV with respect to the block BLK concerned. That is, data DATA_T contains shift amounts ΔVA, ΔVB, . . . , and ΔVG shown in FIG. 13. If elapsed time period Δt is reference value Δt1 or more and reference value Δt2 or less, no additional command is added, and no shift amount is applied to a read voltage with respect to the block BLK concerned.

3.2 Read Operation

Next, a data read operation according to the present embodiment will be described.

3.2.1 Operation of Controller 200

First, the second read command sequence issued by the controller 200 will be described. The remaining operations of the controller 200 are the same as those shown in FIG. 7.

An example of the second read command sequence is presented below:

<XXh><DAT_V><00h><ADD><ADD><ADD><ADD><ADD><30h>

That is, the processor 230 issues command "XXh" described in the first embodiment, as command CMD_T, and further, command "DAT_V" as data DATA_T indicative of shift amount $\Delta V$.

3.2.2 Operation of NAND Flash Memory 100

Described next are operations of the NAND flash memory 100 at the time of receiving the second read command sequence.

Upon receipt of the second read command sequence, the NAND flash memory 100 holds received addressed ADD in the address register 150, holds received command CMD in the command register 160, holds received data DAT_V in any of registers (not shown), and goes into the busy state.

Then, the sequencer 170 retrieves shift amount $\Delta V$ of the read voltage from any of registers (not shown) based on received data DAT_V. The subsequent part of the operation is as described in the first embodiment.

3.3 Advantageous Effect of Present Embodiment

As in the present embodiment, shift amount $\Delta V$ of read voltage VCGRV may be designated by the controller 200. As a matter of course, the present embodiment is applicable to the second embodiment.

4. Fourth Embodiment

A memory system according to the fourth embodiment will be described. The present embodiment differs from the above-described first embodiment in that shift amount $\Delta V$ is set to be different for each of read operations AR, BR, . . . , and GR. In the following description, only the matters different from the first embodiment will be described.

4.1 Shift Amount Table

A shift amount table according to the present embodiment will be described. The shift amount table according to the present embodiment differs from the shift amount table described in the first embodiment with reference to FIG. 9 in that the shift amount table according to the present embodiment holds different shift amounts $\Delta VA'$, $\Delta VB'$, . . . , and $\Delta VG'$ for read operations AR, BR, . . . , and GR, respectively.

To be more specific, the shift amount table according to the present embodiment holds shift amounts $\Delta VA'$, $\Delta VB'$, . . . , and $\Delta VG'$ (for example, $\Delta VA'>\Delta VB'>\Delta VC'>\Delta VD'$, $\Delta VE'<\Delta VF'<\Delta VG'$).

4.2 Advantageous Effect of Present Embodiment

The configuration according to the present embodiment achieves an improvement of the memory system 1 in terms of operation reliability. This advantageous effect will be described below.

As shown in FIG. 10A, threshold voltages that are relatively low (for example, states "Er" to "D") show a tendency that a lower threshold voltage has a larger shift amount, and threshold voltages that are relatively high (for example, states "E" to "G") show a tendency that a higher threshold voltage has a larger shift amount.

In the first embodiment, assume that shift amounts $\Delta VA$, $\Delta VB$, $\Delta VC$, and $\Delta VD$ are set to the same value in accordance with the shift amount of the threshold voltage in state "A". This results in increased shift amounts $\Delta VB$, $\Delta VC$, and $\Delta VD$ as compared to the shift amounts of the threshold voltages in states "B" to "D". Similarly, assume that shift amounts $\Delta VE$, $\Delta VF$, and $\Delta VG$ are set to the same value in accordance with the shift amount of the threshold voltage in state "G". This results in increased shift amounts $\Delta VE$ and $\Delta VF$ as compared to the shift amounts of the threshold voltages in states "E" to "F". From the viewpoint of reducing power consumption, it is more appropriate that shift amounts $\Delta VA$ to $\Delta VG$ are respectively set in accordance with the shift amounts of the threshold voltages in states "A" to "G".

The present embodiment differs from the first embodiment in that different shift amounts $\Delta VA'$, $\Delta VB'$, . . . , and $\Delta VG'$ are set for read operations AR, BR, . . . , and GR, respectively. This enables a read voltage to be shifted to a more appropriate voltage for each of read operations AR, BR, . . . , and GR, thereby achieving a further reduction in power consumption as compared to the first embodiment as well as an improvement in read reliability. As a matter of course, the present embodiment is applicable to the second and third embodiments. For example, when the present embodiment is applied to the second embodiment, that is, when a default read voltage is optimized for the first state, negative shift amounts $\Delta VA'$, $\Delta VB'$, $\Delta VC'$, and $\Delta VD'$ are applicable to read voltages for read operations AR, BR, CR, and DR in the second state. In this case, positive shift amounts $\Delta VE'$, $\Delta VF'$, and $\Delta VG'$ are applicable to read voltages for read operations ER, FR, and GR.

5. Fifth Embodiment

A memory system according to the fifth embodiment will be described. The present embodiment differs from the first embodiment in that different shift amounts $\Delta V$ are respectively set for time ranges that are delimited as the first state based on reference values $\Delta t1$ and $\Delta t2$. In the following description, only the matters different from the first embodiment will be described.

5.1 Shift Amount Table

A shift amount table according to the present embodiment will be described. The shift amount table according to the present embodiment differs from the shift amount table described in the first embodiment with reference to FIG. 9 in that the shift amount table according to the present embodiment holds shift amounts $\Delta VA1$, $\Delta VB1$, . . . , and $\Delta VG1$ as shift amount $\Delta V$ in the case of elapsed time period $\Delta t$ being less than reference value $\Delta t1$, and holds shift amounts $\Delta VA2$, $\Delta VB2$, . . . , and $\Delta VG2$ as shift amount $\Delta V$ in the case of elapsed time period $\Delta t$ being more than reference value $\Delta t2$. Shift amounts $\Delta VA1$, $\Delta VB1$, . . . , and $\Delta VG1$ are respectively different in value from $\Delta VA2$, $\Delta VB2$ . . . , and $\Delta VG2$.

5.2 Advantageous Effect of Present Embodiment

The configuration according to the present embodiment achieves an improvement of the memory system 1 in terms of operation reliability. This advantageous effect will be described below.

The aforementioned influence of capacitance coupling depending on elapsed time period $\Delta t$ may vary between a time range in the first state before a voltage of the selected word line WL goes into the second state and a time range in the first state after a voltage of the selected word line WL goes into the second state. Therefore, if the same shift amount ΔV is applied both for a read voltage in the case of elapsed time period Δt being less than reference value Δt1 and a read voltage in the case of elapsed time period Δt being more than reference value Δt2, the number of fail bits may not be reduced. From the viewpoint of reducing the number of fail bits, it is more appropriate that different shift amount ΔV is set for each of time ranges that are delimited as the first state based on reference values Δt1 and Δt2.

Accordingly, the present embodiment differs from the first embodiment in that different shift amounts ΔV are respectively set for time ranges that are delimited as the first state based on reference values Δt1 and Δt2. This enables a read voltage to be shifted to a more appropriate voltage in the first state, thereby achieving a further reduction in the number of fail bits as compared to the first embodiment as well as an improvement in read reliability. As a matter of course, the present embodiment is applicable to the third and fourth embodiments.

6. Sixth Embodiment

A memory system according to the sixth embodiment will be described. The present embodiment differs from the third embodiment in that three or more values are used as a reference value for elapsed time period Δt. In the following description, only the matters different from the third embodiment will be described.

6.1 Additional Command Table 222

The additional command table 222 according to the present embodiment will be described. As shown in FIG. 14A, the table 222 according to the present embodiment uses four reference values, that is, first reference value Δt1', second reference value Δt2', third reference value Δt3', and fourth reference value Δt4' (Δt1'<Δt2'<Δt3'<Δt4'). Those reference values are held in the aforementioned reference value information 223 also.

In the example shown in FIG. 14A, in the case of elapsed time period Δt being less than reference value Δt1', DATA_T1 is added along with CMD_T, and shift amounts ΔVA1', ΔVB1', ..., and ΔVG1' are applied to read voltages VA, VB, ..., and VG with respect to the block BLK concerned.

In the case of elapsed time period Δt being reference value Δt1' or more and less than reference value Δt2', DATA_T2 is added along with CMD_T, and shift amounts ΔVA2', ΔVB2', ..., and ΔVG2' are applied to read voltages VA, VB, ..., and VG with respect to the block BLK concerned.

In the case of elapsed time period Δt being reference value Δt2' or more and reference value Δt3' or less, there are neither addition of an additional command nor application of a shift amount to a read voltage with respect to the block BLK concerned.

In the case of elapsed time period Δt being more than reference value Δt3' and reference value Δt4' or less, DATA_T3 is added along with CMD_T, and shift amounts ΔVA3', ΔVB3', ..., and ΔVG3' are applied to read voltages VA, VB, ..., and VG with respect to the block BLK concerned.

In the case of elapsed time period Δt being more than reference value Δt4', DATA_T4 is added along with CMD_T, and shift amounts ΔVA4', ΔVB4', ..., and ΔVG4' are applied to read voltages VA, VB, ..., and VG with respect to the block BLK concerned.

6.2 Operation of Controller 200

Figure 14B:
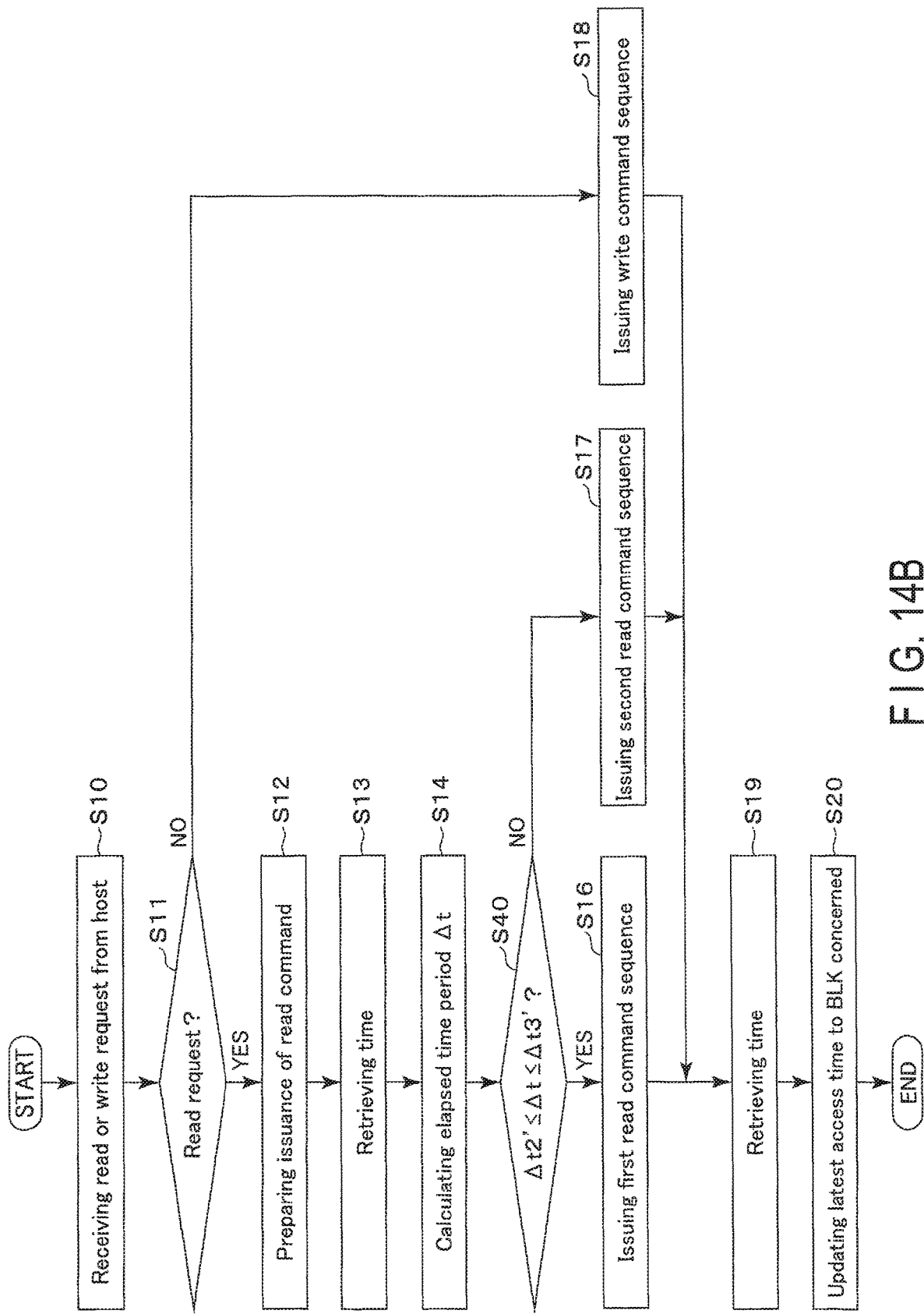
FIG. 14B is a flowchart of read and write operations according to the sixth embodiment.

Next, operations of the controller 200 will be described. FIG. 14B is a flowchart showing how the controller 200 operates when performing read and write operations according to the present embodiment.

As shown in FIG. 14B, the present embodiment differs from the first embodiment described with reference to FIG. 7, in that if a comparison result between elapsed time period Δt and reference values Δt1', Δt2', Δt3', and Δt4' shows that elapsed time period Δt is reference value Δt2' or more and reference value Δt3' or less (YES in step S40), the NAND interface circuit 250 issues the first read command sequence (step S16). Another difference is that if elapsed time period Δt is less than reference value Δt1', is reference value Δt1' or more and less than reference value Δt2', is more than reference value Δt3' and reference value Δt4' or less, or is more than reference value Δt4' (NO in step S40), the NAND interface circuit 250 issues the second read command sequence (step S17). The remaining operations of the controller 200 are the same as those shown in FIG. 7.

6.3 Advantageous Effect of Present Embodiment

The configuration according to the present embodiment achieves an improvement of the memory system 1 in terms of operation reliability. This advantageous effect will be described below.

The aforementioned influence of capacitance coupling depending on elapsed time period Δt may not be constant over a time range in the first state before a voltage of the selected word line WL goes into the second state. The same applies to a time range in the first state after a voltage of the selected word line WL goes into the second state. Therefore, from the viewpoint of reducing the number of fail bits, it is more appropriate to further delimit a time range in the first state into a plurality of time ranges, and set different shift amount ΔV for each of the delimited time ranges.

Accordingly, the present embodiment differs from the third embodiment in that reference values of elapsed time period Δt are set more finely using first reference value Δt1', second reference value Δt2', third reference value Δt3', and fourth reference value Δt4'. Furthermore, reference values of elapsed time period Δt are set based on the premise that a time range in which elapsed time period Δt is reference value Δt2' or more and Δt3' or less corresponds to the second state, and the other time ranges correspond to the first state. This enables a read voltage to be shifted to a more appropriate voltage in the first state, thereby achieving a further reduction in the number of fail bits as compared to the third embodiment as well as an improvement in read reliability. As a matter of course, the present embodiment is applicable to the fourth embodiment.

7. Seventh Embodiment

A memory system according to the seventh embodiment will be described next. The present embodiment differs from the first embodiment in that reference values Δt1 and Δt2 of elapsed time period Δt are varied depending on a temperature of the NAND flash memory 100. In the following description, only the matters different from the first embodiment will be described.

7.1 Configuration

FIG. 15 shows a configuration of the NAND flash memory 100 according to the present embodiment. The NAND flash memory 100 according to the present embodiment is equal in configuration to the first embodiment except that the NAND flash memory 100 includes a thermometer 180 that measures a temperature of the NAND flash memory 100.

The thermometer 180 is capable of measuring a temperature of any region in the NAND flash memory 100. It is preferable to measure a temperature of a region that exhibits the greatest temperature change in the NAND flash memory 100, for example, the memory cell array 110. To be more specific, it is preferable to measure a temperature of the center of the memory cell array 110. If it is difficult to measure a temperature of the center, a temperature of the ends of the memory cell array 110 may be measured. If it is also difficult to measure a temperature of the ends, a temperature of a region in proximity to the memory cell array 110, for example, a temperature of the circumference of the memory cell array 110 may be measured. As a matter of course, a region to be measured in temperature is not limited to the above.

Next, the reference value information 223 according to the present embodiment will be described. As described above, the controller 200 holds the reference value information 223 in the memory 220, for example. As shown in FIG. 16, in the present embodiment, the reference value information 223 is held as, for example, a table (referred to as a reference value information table).

As shown in FIG. 16, the reference value information table includes a plurality of entries (three entries in the example of FIG. 16). Each entry holds a temperature and a reference value corresponding to the temperature. In the example shown in FIG. 16, in the case of temperature T being less than T1, first reference value $\Delta t1a$ and second reference value $\Delta t2a$ are set. In the case of temperature T being T1 or more and T2 or less, first reference value $\Delta t1b$ and second reference value $\Delta t2b$ are set. In the case of temperature T being more than T2, first reference value $\Delta t1c$ and second reference value $\Delta t2c$ are set.

For example, T1 is 20° C. and T2 is 30° C. For example, $\Delta t1a$ is 10 ms and $\Delta t2a$ is 100 ms. For example, $\Delta t1b$ is 20 ms and $\Delta t2b$ is 200 ms. For example, $\Delta t1c$ is 30 ms and $\Delta t2c$ is 300 ms. Those values are merely examples and are not limitations.

7.2 Read Operation

Next, a data read operation according to the present embodiment will be described.

7.2.1 Operation of Controller 200

First, operations of the controller 200 will be described. FIG. 17 is a flowchart showing how the controller 200 operates when performing read and write operations.

When completing the preparation for issuance of the read command, the processor 230, for example, of the controller 200 retrieves a temperature from the NAND flash memory 100 (step S50). For example, the processor 230 orders the NAND interface circuit 250 to issue a temperature retrieval command sequence. Based on this order, the NAND interface circuit 250 issues the temperature retrieval command sequence. The NAND interface circuit 250 then receives a temperature from the NAND flash memory 100. A temperature retrieval method is not limited to the above.

The processor 230, for example, of the controller 200 retrieves reference values $\Delta t1$ and $\Delta t2$ from the reference value information table based on the temperature retrieved in step S50 (step S51). The processor 230 then calculates elapsed time period $\Delta t$ by retrieving current time, and compares calculated elapsed time period $\Delta t$ with retrieved reference values $\Delta t1$ and $\Delta t2$. The remaining operations of the controller 200 are the same as those shown in FIG. 7.

7.2.2 Operation of NAND flash memory 100

Described next is an operation of the NAND flash memory 100 at the time of the read operation.

Upon receipt of the temperature retrieval command sequence from the NAND interface circuit 250, the sequencer 170, for example, of the NAND flash memory 100 retrieves a temperature from the thermometer 180. The sequencer 170 transmits the retrieved temperature to the NAND interface circuit 250. The remaining operations of the NAND flash memory 100 are the same as those shown in FIGS. 8A and 8B.

7.3 Advantageous Effect of Present Embodiment

The configuration according to the present embodiment achieves an improvement of the memory system 1 in terms of operation reliability. This advantageous effect will be described below.

In the first state, the aforementioned influence of capacitance coupling depending on elapsed time period $\Delta t$ varies depending on a temperature. The same applies to the second state. Unless reference values $\Delta t1$ and $\Delta t2$ are values in consideration of a temperature, the number of fail bits may not be reduced. From the viewpoint of reducing the number of fail bits, it is more appropriate to set shift amounts $\Delta VA$ to $\Delta VG$ in accordance with a temperature.

Accordingly, the present embodiment differs from the first embodiment in that reference values $\Delta t1$ and $\Delta t2$ of elapsed time period $\Delta t$ are varied depending on a temperature of the NAND flash memory 100. This enables a read voltage to be shifted to a more appropriate voltage in the first state, thereby achieving a further reduction in the number of fail bits as compared to the first embodiment as well as an improvement in read reliability. As a matter of course, the present embodiment is applicable to the second to sixth embodiments.

8. Eighth Embodiment

A memory system according to the eighth embodiment will be described next. The present embodiment differs from the first embodiment in that in the case of elapsed time period $\Delta t$ being less than reference value $\Delta t1$ or more than reference value $\Delta t2$, the ON time period of select transistor ST1 of a non-selected NAND string is extended until a voltage of the non-selected word line WL rises up to voltage VREAD. In the following description, only the matters different from the first embodiment will be described.

8.1 Operation of NAND Flash Memory 100

Described below are operations of the NAND flash memory 100 at the time of a read operation. Hereinafter, a case of reading middle-page data will be descried as an example.

When the NAND flash memory 100 receives the second read command sequence, the driver circuit 130 applies voltage VREAD to the non-selected word line WL and turns on select transistor ST1 of a NAND string. When read voltage VREAD of the non-selected word line WL has risen completely, the driver circuit 130 then applies voltage Low (voltage to turn off select transistor ST1) to SGD of a non-selected NAND string, thereby turning off select transistor ST1 of a non-selected NAND string. A timing at which select transistor ST1 of a non-selected NAND string is turned off is held in a ROM fuse within the memory cell array 110, for example. The remaining operations of the NAND flash memory 100 are the same as those shown in FIG. 8B.

Figure 18:
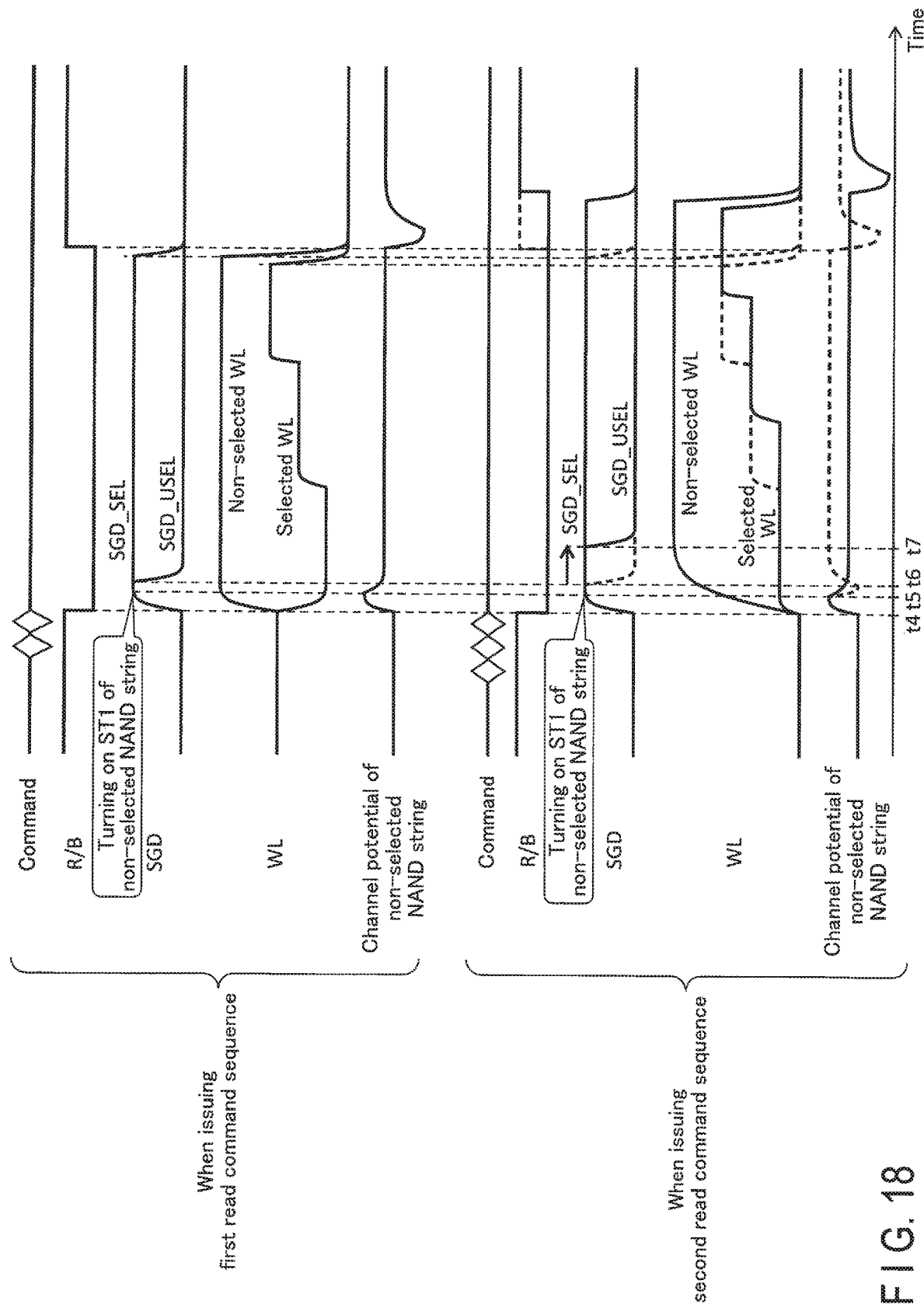
FIG. 18 is a timing chart of a command sequence and various signals during a read operation according to the eighth embodiment.

The upper half of FIG. 18 shows an operation performed in the case where the controller 200 issues the first read command sequence that contains no additional command. The lower half of FIG. 18 shows an operation performed in the case where the controller 200 issues the second read command sequence that contains an additional command. For both of the cases, FIG. 18 shows timing charts of a command, ready/busy signal R/B, an SGD voltage (SG- D_USEL) of a non-selected NAND string, an SGD voltage (SGD_SEL) of a selected NAND string, a voltage of the non-selected word line WL, a voltage of the selected word line WL, and a channel potential of a non-selected NAND string. In FIG. 18, the operations of the NAND flash memory 100 are executed under control of the sequencer 170, for example.

First, the upper half of FIG. 18 will be described. At time t4, SGD of a NAND string has a voltage of 0V, whereas word line WL has a voltage raised above 0V (for example, a voltage of 4V) under the effect of capacitance coupling. That is, a voltage of word line WL is in the second state.

At time t4, the driver circuit 130 applies voltage High (voltage to turn on select transistor ST1) to SGD of a NAND string, read voltage VCGRV to the selected word line WL, and voltage VREAD to the non-selected word line WL, respectively.

At time t5, select transistor ST1 of a NAND string is turned on. When select transistor ST1 of a non-selected NAND string is turned on, a channel potential of the non-selected NAND string decreases. At time t5, a non-selected word line WL rises up to voltage VREAD, and charging is completed. At time t4, word line WL has a voltage raised above 0V. Thus, a charging time of the non-selected word line WL is short.

At time t6, the driver circuit 130 applies voltage Low to SGD of a non-selected NAND string, thereby turning off select transistor ST1 of the non-selected NAND string.

Thereafter, when the application of read voltage VCGRV to the selected word line WL is completed, the driver circuit 130 applies a voltage of 0V to word line WL and voltage Low to SGD of a selected NAND string, and sets a ready/busy signal to ready.

Next, the lower half of FIG. 18 will be described. At time t4, each of SGD of a NAND string and a word line WL has a voltage of 0V. That is, a voltage of word line WL is in the first state.

Herein, assume that a timing at which select transistor ST1 of a non-selected NAND string is turned off is set to the same as the timing (time t6) shown in the upper half of FIG. 18. The timing chart under this assumption is indicated by a broken line in the lower half of FIG. 18.

At time t4, the driver circuit 130 applies voltage High to SGD of a NAND string, and read voltage VCGRV to the selected word line WL, and voltage VREAD to the non-selected word line WL, respectively.

At time t5, select transistor ST1 of a NAND string is turned on. When select transistor ST1 of a non-selected NAND string is turned on, a channel potential of the non-selected NAND string decreases. At time t5, non-selected word line WL has not risen up to voltage VREAD, and charging has not been completed.

At time t6, the driver circuit 130 applies voltage Low to SGD of a non-selected NAND string, thereby turning off select transistor ST1 of the non-selected NAND string.

Thereafter, when the application of read voltage VCGRV to the selected word line WL is completed, the driver circuit 130 applies a voltage of 0V to word line WL and voltage Low to SGD of a selected NAND string, and sets a ready/busy signal to ready.

8.2 Advantageous Effect of Present Embodiment

The configuration according to the present embodiment achieves an improvement of the memory system 1 in terms of operation reliability. This advantageous effect will be described below.

Assume that a timing at which select transistor ST1 of a non-selected NAND string is turned off is set to the same as the timing shown in the upper half of FIG. 18. In this case, as shown in the lower half of FIG. 18, charging of the non-selected word line WL has not been completed at time t6. If select transistor ST1 of a non-selected NAND string is turned off at this timing, non-selected word line WL is charged even after select transistor ST1 of a non-selected NAND string is turned off. Thus, a channel potential of SGD of a non-selected NAND string rises. This may decrease reliability of the non-selected NAND strings due to hot carriers, etc.

Thus, the present embodiment differs from the first embodiment in that in the case of elapsed time period Δt being less than reference value Δt1 or more than reference value Δt2, the ON time period of select transistor ST1 of a non-selected NAND string is extended until a voltage of the non-selected word line WL rises up to voltage VREAD. The timing chart in this case is indicated by a solid line in the lower half of FIG. 18.

At time t6, charging of the non-selected word line WL is not completed. Thus, voltage Low is not applied to SGD of a non-selected NAND string.

At time t7, non-selected word line WL has risen up to voltage VREAD, and charging is completed. At this timing, voltage Low is applied to SGD of a non-selected NAND string, and select transistor ST1 of a non-selected NAND string is turned off. After select transistor ST1 of a non-selected NAND string is turned off, non-selected word line WL is not charged, so that a channel potential of SGD of the non-selected NAND string does not rise.

Extended ON time period of select transistor ST1 of a non-selected NAND string causes delay in a timing at which a ready/busy signal is set to ready, a timing at which voltage Low is applied to SGD of a selected NAND string, and a timing at which a voltage of 0V is applied to word line WL, as compared to the timings shown in the upper half of FIG. 18.

Regarding a timing at which select transistor ST1 of the non-selected NAND string is turned off, the present embodiment is configured in a manner such that this timing in the first state is varied from the timing in the second state. Thus, the present embodiment prevents the decrease in reliability of the non-selected NAND strings as compared to the first embodiment as well as an improvement in read reliability as in the first embodiment. As a matter of course, the present embodiment is applicable to the second to seventh embodiments. For example, in the case of applying the present embodiment to the second embodiment, regarding a timing at which select transistor ST1 of a non-selected NAND string is turned off, this timing in the first state can be varied from the timing in the second state. To be more specific, ON time period of select transistor ST1 of a non-selected NAND string in the first state can be extended.

9. Modification Etc.

As described above, the memory system according to the embodiments comprises the semiconductor memory including the memory cell array, the memory cell array including the memory cell configured to hold data, and the controller configured to issue the first read command sequence (without prefixCMD: second state) for reading the data from the memory cell after the lapse of the first time period from access to the semiconductor memory, and issue the second read command sequence (with prefixCMD: first state) after the lapse of the second time period from access to the semiconductor memory, the second time period being different from the first time period. The memory cell is configured to hold the data of 2 bits or more (4 or more threshold distributions). When the controller issues the first read command sequence, the semiconductor memory applies to the memory cell, the first voltage (VCGRV on the low threshold voltage side) and the second voltage (VCGRV on the high threshold voltage side) different from the first voltage. When the controller issues the second read command sequence, the semiconductor memory applies to the memory cell, the third voltage (VCGRV on the low threshold voltage side) different from the second voltage, and the fourth voltage (VCGRV on the high threshold voltage side) different from the first voltage and the third voltage. The third voltage is more than the first voltage, and the fourth voltage is less than the second voltage (the shift direction reverses depending on a threshold voltage). The first read command sequence and the second read command sequence read the same bits from the data of 2 bits or more held by the memory cell (the first to fourth voltages are voltages to read the same bits).

The first read operation after power-on will be also described. When the NAND flash memory 100 is powered off, a voltage of word line WL goes into the first state. It is preferable to improve read reliability even when a read operation is performed for the first time after power-on.

As one modification, the first embodiment may be modified in a manner such that immediately after power-on, the controller 200 sets the latest access time of the table 221 so that elapsed time period Δt takes a value larger than reference value Δt2 (for example, Jan. 1, 1900, 00:00:00). Instead of performing this processing, the controller 200 may be configured to calculate elapsed time period Δt when a time is set in the table 221 at step S14 in FIG. 7, and issue the second read command sequence when a time is unset in the table 221 (step S17). This achieves an improvement in read reliability even when a read operation is performed for the first time after power-on. As a matter of course, the present modification is applicable to the second to eighth embodiments. For example, in the case of applying the present modification to the second embodiment, the controller 200 may be configured to calculate elapsed time period Δt when a time is set in the table 221 at step S14 in FIG. 11, and issue the first read command sequence when a time is unset in the table 221 (step S16).

The above embodiments are independently implementable. For example, varying a time when voltage High is applied to SGD of a non-selected NAND string described in the eighth embodiment is implementable without depending on the first to seventh embodiments. That is, in the first state, a time when voltage High is applied to SGD of a non-selected NAND string may be varied (for example, a time range of applying voltage High may be extended) without varying a voltage of the selected word line WL. In this case, a default read voltage may be optimized for either the first state or the second state. Similarly, the other embodiments are independently implementable. On the other hand, the first and third to eighth embodiments are implementable in combination. Furthermore, the second to eight embodiments are implementable in combination.

Described in the above embodiments was the case of using a 3-bit memory cell; however, this case is not a limitation. The embodiments are applicable to the case of using a memory cell having 2 bits or more.

In addition, described in the above embodiments was the case in which a NAND flash memory is used as an example of a semiconductor memory device. However, the embodiments are applicable to all other types of a semiconductor memory in addition to a NAND flash memory, and are further applicable to various types of a memory device other than a semiconductor memory. In the flowcharts described in the above embodiments, the order of processing may be shuffled to the extent possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a semiconductor memory including a memory cell array, the memory cell array including a memory cell configured to hold data; and
a controller configured to issue a first read command sequence for reading the data from the memory cell after a lapse of a first time period from access to the semiconductor memory, and issue a second read command sequence after a lapse of a second time period from access to the semiconductor memory, the second time period being different from the first time period, wherein:
the memory cell is configured to hold the data of 2 bits or more;
when the controller issues the first read command sequence, the semiconductor memory applies a first voltage and a second voltage different from the first voltage to the memory cell;
when the controller issues the second read command sequence, the semiconductor memory applies a third voltage different from the second voltage, and a fourth voltage different from the first voltage and the third voltage to the memory cell;
the third voltage is more than the first voltage, and the fourth voltage is less than the second voltage; and
the first read command sequence and the second read command sequence read the same bits from the data of 2 bits or more held by the memory cell.

2. A memory system comprising:
a semiconductor memory including a memory cell array, the memory cell array including a memory cell configured to hold data; and
a controller configured to issue a first read command sequence for reading the data from the memory cell after a lapse of a first time period from access to the semiconductor memory, and issue a second read command sequence after a lapse of a second time period from access to the semiconductor memory, the second time period being different from the first time period, wherein:
the memory cell is configured to hold the data of 2 bits or more;
when the controller issues the first read command sequence, the semiconductor memory applies a first voltage and a second voltage different from the first voltage to the memory cell;
when the controller issues the second read command sequence, the semiconductor memory applies a third voltage different from the second voltage, and a fourth voltage different from the first voltage and the third voltage to the memory cell;

the third voltage is less than the first voltage, and the fourth voltage is more than the second voltage; and the first read command sequence and the second read command sequence read the same bits from the data of 2 bits or more held by the memory cell.

3. The system according to claim 1, wherein:
a threshold voltage of the memory cell takes, in accordance with data to hold, a value within a first threshold range, a value within a second threshold range greater in voltage than the first threshold range, a value within a third threshold range greater in voltage than the second threshold range, or a value within a fourth threshold range greater in voltage than the third threshold range;
the first voltage and the third voltage are voltages between the first threshold range and the second threshold range; and
the second voltage and the fourth voltage are voltages between the third threshold range and the fourth threshold range.

4. The system according to claim 1, wherein:
the controller issues the first read command sequence in a case where an elapsed time period since a latest access to the semiconductor memory falls within a first time range; and
the controller issues the second read command sequence in a case where the elapsed time period falls within a second time range shorter than the first time range, or within a third time range longer than the first time range.

5. The system according to claim 2, wherein:
the controller issues the second read command sequence in a case where an elapsed time period since a latest access to the semiconductor memory falls within a first time range; and
the controller issues the first read command sequence in a case where the elapsed time period falls within a second time range shorter than the first time range, or within a third time range longer than the first time range.

6. The system according to claim 1, wherein:
when reading a first bit from the data of 2 bits held by the memory cell, the semiconductor memory uses the first to fourth voltages;
when reading a second bit different from the first bit, the semiconductor memory applies:
 a fifth voltage and a sixth voltage different from the fifth voltage to the memory cell in a case where the controller issues the first read command sequence; and
 a seventh voltage different from the sixth voltage, and an eighth voltage different from the fifth voltage and the seventh voltage to the memory cell in a case where the controller issues the second read command sequence;
the seventh voltage is more than the fifth voltage, and the eighth voltage is less than the sixth voltage;
a difference between the first voltage and the third voltage varies from a difference between the fifth voltage and the seventh voltage; and
a difference between the second voltage and the fourth voltage varies from a difference between the sixth voltage and the eighth voltage.

7. The system according to claim 2, wherein:
when reading a first bit from the data of 2 bits held by the memory cell, the semiconductor memory uses the first to fourth voltages;
when reading a second bit different from the first bit, the semiconductor memory applies:
 a fifth voltage and a sixth voltage different from the fifth voltage to the memory cell in a case where the controller issues the first read command sequence; and
 a seventh voltage different from the sixth voltage, and an eighth voltage different from the fifth voltage and the seventh voltage to the memory cell in a case where the controller issues the second read command sequence;
the seventh voltage is less than the fifth voltage, and the eighth voltage is more than the sixth voltage;
a difference between the first voltage and the third voltage varies from a difference between the fifth voltage and the seventh voltage; and
a difference between the second voltage and the fourth voltage varies from a difference between the sixth voltage and the eighth voltage.

8. The system according to claim 4, wherein when the second read command sequence is issued, the semiconductor memory applies:
the third voltage and the fourth voltage to the memory cell during the second time range; and
a fifth voltage different from the third voltage and the fourth voltage, and a sixth voltage different from the third to fifth voltages to the memory cell during the third time range.

9. The system according to claim 1, wherein:
the controller issues the first read command sequence in a case where an elapsed time period since a latest access to the semiconductor memory falls within a first time range;
the controller issues the second read command sequence in a case where the elapsed time period falls within a second time range shorter than the first time range, within a third time range longer than the first time range, within a fourth time range shorter than the second time range, or within a fifth time range longer than the third time range; and
when the second read command sequence is issued, the semiconductor memory applies:
 the third voltage and the fourth voltage to the memory cell during the second time range; and
 a fifth voltage different from the third voltage and the fourth voltage, and a sixth voltage different from the third to fifth voltages to the memory cell during the third time range;
 a seventh voltage different from the third to sixth voltages, and an eighth voltage different from the third to seventh voltages to the memory cell during the fourth time range; and
 a ninth voltage different from the third to eighth voltages, and a tenth voltage different from the third to ninth voltages to the memory cell during the fifth time range.

10. The system according to claim 4, wherein the first to third time ranges are determined based on a temperature of the semiconductor memory.

11. The system according to claim 1, wherein the semiconductor memory further comprises:
a first memory string in which a first select transistor and a first memory cell are coupled in series;
a second memory string in which a second select transistor and a second memory cell are coupled in series;
a word line coupled to gates of the first memory cell and the second memory cell;

a first select gate line coupled to a gate of the first select transistor; and
a second select gate line coupled to a gate of the second select transistor, wherein:
when the controller issues the first read command sequence for reading data from the first memory cell, the semiconductor memory applies:
the first voltage and the second voltage to the word line; and
a fifth voltage to the second select gate line over a first time range;
when the controller issues the second read command sequence for reading data from the first memory cell, the semiconductor memory applies:
the third voltage and the fourth voltage to the word line; and
a sixth voltage to the second select gate line over a second time range; and
the second time range differs from the first time range.

12. The system according to claim 11, wherein the second time range is longer than the first time range.

13. The system according to claim 2, wherein the semiconductor memory further comprises:
a first memory string in which a first select transistor and a first memory cell are coupled in series;
a second memory string in which a second select transistor and a second memory cell are coupled in series;
a word line coupled to gates of the first memory cell and the second memory cell;
a first select gate line coupled to a gate of the first select transistor; and
a second select gate line coupled to a gate of the second select transistor, wherein:
when the controller issues the second read command sequence for reading data from the first memory cell, the semiconductor memory applies:
the third voltage and the fourth voltage to the word line; and
a fifth voltage to the second select gate line over a first time range;
when the controller issues the first read command sequence for reading data from the first memory cell, the semiconductor memory applies:
the first voltage and the second voltage to the word line; and
a sixth voltage to the second select gate line over a second time range; and
the second time range differs from the first time range.

14. The system according to claim 13, wherein the second time range is longer than the first time range.

15. The system according to claim 1, wherein the controller issues the second read command sequence in a case where a read command sequence is performed first after the memory system is powered on.

16. The system according to claim 2, wherein the controller issues the first read command sequence in a case where a read command sequence is performed first after the memory system is powered on.

17. The system according to claim 1, wherein:
the second read command sequence contains an additional command that is added to the first read command sequence in accordance with an elapsed time period since a latest access to the semiconductor memory; and
the additional command designates values of the third voltage and the fourth voltage in accordance with the elapsed time period and any of the 2 bits or more of the data, which is an object to be read.

18. The system according to claim 1, wherein:
the second read command sequence contains an additional command and data that are added to the first read command sequence in accordance with an elapsed time period since a latest access to the semiconductor memory; and
the data designates values of the third voltage and the fourth voltage.

19. The system according to claim 1, wherein:
the semiconductor memory includes a plurality of blocks;
the blocks each include a plurality of the memory cells coupled in series; and
the access is reading or writing with respect to the blocks.

20. The system according to claim 1, wherein:
when the controller issues the first read command sequence, the semiconductor memory sequentially applies the first voltage and the second voltage as a first read voltage; and
when the controller issues the second read command sequence, the semiconductor memory sequentially applies the third voltage and the fourth voltage as a second read voltage.

21. A memory system comprising:
a semiconductor memory including a memory cell array, the memory cell array including a memory cell configured to hold data; and
a controller configured to issue a first read command sequence for reading the data from the memory cell after a lapse of a first time period from access to the semiconductor memory, and issue a second read command sequence after a lapse of a second time period from access to the semiconductor memory, the second time period being different from the first time period,
wherein the semiconductor memory further includes:
a first memory string in which a first select transistor and a first memory cell are coupled in series;
a second memory string in which a second select transistor and a second memory cell are coupled in series;
a word line coupled to gates of the first memory cell and the second memory cell;
a first select gate line coupled to a gate of the first select transistor; and
a second select gate line coupled to a gate of the second select transistor;
the memory cell is configured to hold the data of 2 bits or more;
when the controller issues the first read command sequence, the semiconductor memory applies:
a first voltage and a second voltage to the word line; and
a fifth voltage to the second select gate line over a first time range;
when the controller issues the second read command sequence, the semiconductor memory applies:
a third voltage and a fourth voltage to the word line; and
a sixth voltage to the second select gate line over a second time range;
the second time range differs from the first time range; and
the first read command sequence and the second read command sequence read the same bits from the data of 2 bits or more held by the memory cell.

22. The system according to claim 21, wherein the second time range is longer than the first time range.

23. The system according to claim 2, wherein:
a threshold voltage of the memory cell takes, in accordance with data to hold, a value within a first threshold range, a value within a second threshold range greater in voltage than the first threshold range, a value within a third threshold range greater in voltage than the second threshold range, or a value within a fourth threshold range greater in voltage than the third threshold range;
the first voltage and the third voltage are voltages between the first threshold range and the second threshold range; and
the second voltage and the fourth voltage are voltages between the third threshold range and the fourth threshold range.

24. The system according to claim 5, wherein the first to third time ranges are determined based on a temperature of the semiconductor memory.

25. The system according to claim 2, wherein:
the second read command sequence contains an additional command that is added to the first read command sequence in accordance with an elapsed time period since a latest access to the semiconductor memory, and
the additional command designates values of the third voltage and the fourth voltage in accordance with the elapsed time period and any of the 2 bits or more of the data, which is an object to be read.

26. The system according to claim 2, wherein:
the second read command sequence contains an additional command and data that are added to the first read command sequence in accordance with an elapsed time period since a latest access to the semiconductor memory; and
the data designates values of the third voltage and the fourth voltage.

27. The system according to claim 2, wherein:
the semiconductor memory includes a plurality of blocks,
the blocks each include a plurality of the memory cells coupled in series, and
the access is reading or writing with respect to the blocks.

28. The system according to claim 2, wherein:
when the controller issues the first read command sequence, the semiconductor memory sequentially applies the first voltage and the second voltage as a first read voltage; and
when the controller issues the second read command sequence, the semiconductor memory sequentially applies the third voltage and the fourth voltage as a second read voltage.

\* \* \* \* \*